(12) United States Patent
Nakamura et al.

(10) Patent No.: US 7,755,957 B2
(45) Date of Patent: Jul. 13, 2010

(54) SEMICONDUCTOR MEMORY, METHOD OF CONTROLLING THE SEMICONDUCTOR MEMORY, AND MEMORY SYSTEM

(75) Inventors: Toshikazu Nakamura, Kawasaki (JP); Tomohiro Kawakubo, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 120 days.

(21) Appl. No.: 12/208,818

(22) Filed: Sep. 11, 2008

(65) Prior Publication Data
US 2009/0190418 A1 Jul. 30, 2009

(30) Foreign Application Priority Data
Jan. 30, 2008 (JP) .............................. 2008-019599

(51) Int. Cl.
*G11C 7/00* (2006.01)
(52) U.S. Cl. .................. 365/200; 365/201; 365/230.08; 365/230.06; 365/189.07
(58) Field of Classification Search .................. 365/200, 365/201, 230.08, 230.06, 189.07, 184, 233.5
See application file for complete search history.

(56) References Cited

U.S. PATENT DOCUMENTS

| | | | |
|---|---|---|---|
| 6,396,746 B2 | 5/2002 | Ikeda | |
| 6,414,879 B1 | 7/2002 | Ikeda | |
| 6,545,924 B2 | 4/2003 | Fujieda et al. | |
| 6,762,963 B2 | 7/2004 | Inoue et al. | |
| 6,992,937 B2 * | 1/2006 | Tran et al. | ................... 365/200 |

FOREIGN PATENT DOCUMENTS

| | | |
|---|---|---|
| JP | 2001-243764 A | 9/2001 |
| JP | 2002-74943 A | 3/2002 |
| JP | 2003-68071 A | 3/2003 |

* cited by examiner

*Primary Examiner*—David Lam
(74) *Attorney, Agent, or Firm*—Arent Fox LLP

(57) ABSTRACT

A semiconductor memory comprising an address transition detection circuit for detecting a transition of an address and outputs an address detection signal; an address input circuit for inputting an input address based upon the address detection signal; a command judgment circuit for decoding a command signal input and outputting a command judgment signal; a redundancy circuit for making a redundancy judgment based upon a redundancy judgment signal indicating timing of a redundancy judgment, wherein the redundancy circuit includes a redundancy judgment speed-up circuit for controlling an output of the redundancy judgment signal based upon a predetermined command signal.

20 Claims, 23 Drawing Sheets

SEMICONDUCTOR MEMORY, METHOD OF CONTROLLING THE SEMICONDUCTOR MEMORY, AND MEMORY SYSTEM

CROSS-REFERENCE TO RELATED APPLICATIONS

This application claims the benefit of priority from Japanese Patent Application No. 2008-19599 filed on Jan. 30, 2008, the entire contents of which are incorporated herein by reference.

BACKGROUND OF THE INVENTION

1. Field of the Invention

This application relates to a semiconductor memory having redundancy memory cells to relieve defects.

2. Description of Related Art

A semiconductor memory includes redundancy memory cells in order to relieve defects and improve yields. The semiconductor memory judges whether an address signal supplied together with an access request coincides with a defective address (a redundancy judgment) or not and if the address signal coincides with the defective address, the semiconductor memory accesses a redundancy memory cell instead of a real memory cell. Techniques related to memory redundancy are disclosed in Japanese Laid-open Patent Publication No. 2002-74943, Japanese Laid-open Patent Publication No. 2001-243764, and Japanese Laid-open Patent Publication No. 2003-68071.

SUMMARY

According to one aspect of an embodiment, a semiconductor memory comprises: an address transition detection circuit that detects a transition of an address and outputs an address detection signal; an address input circuit that inputs an input address based upon the address detection signal; a command judgment circuit that decodes a command signal input and outputs a command judgment signal; a redundancy circuit that makes a redundancy judgment based on a redundancy judgment signal indicating the timing of a redundancy judgment, wherein the redundancy circuit includes a redundancy judgment speed-up circuit that controls an output of the redundancy judgment signal based upon a predetermined command signal.

Additional advantages and novel features of the invention will be set forth in part in the description that follows, and in part will become more apparent to those skilled in the art upon examination of the following or upon learning the various aspects of the invention.

DESCRIPTION OF PREFERRED EMBODIMENTS

Figure 1:
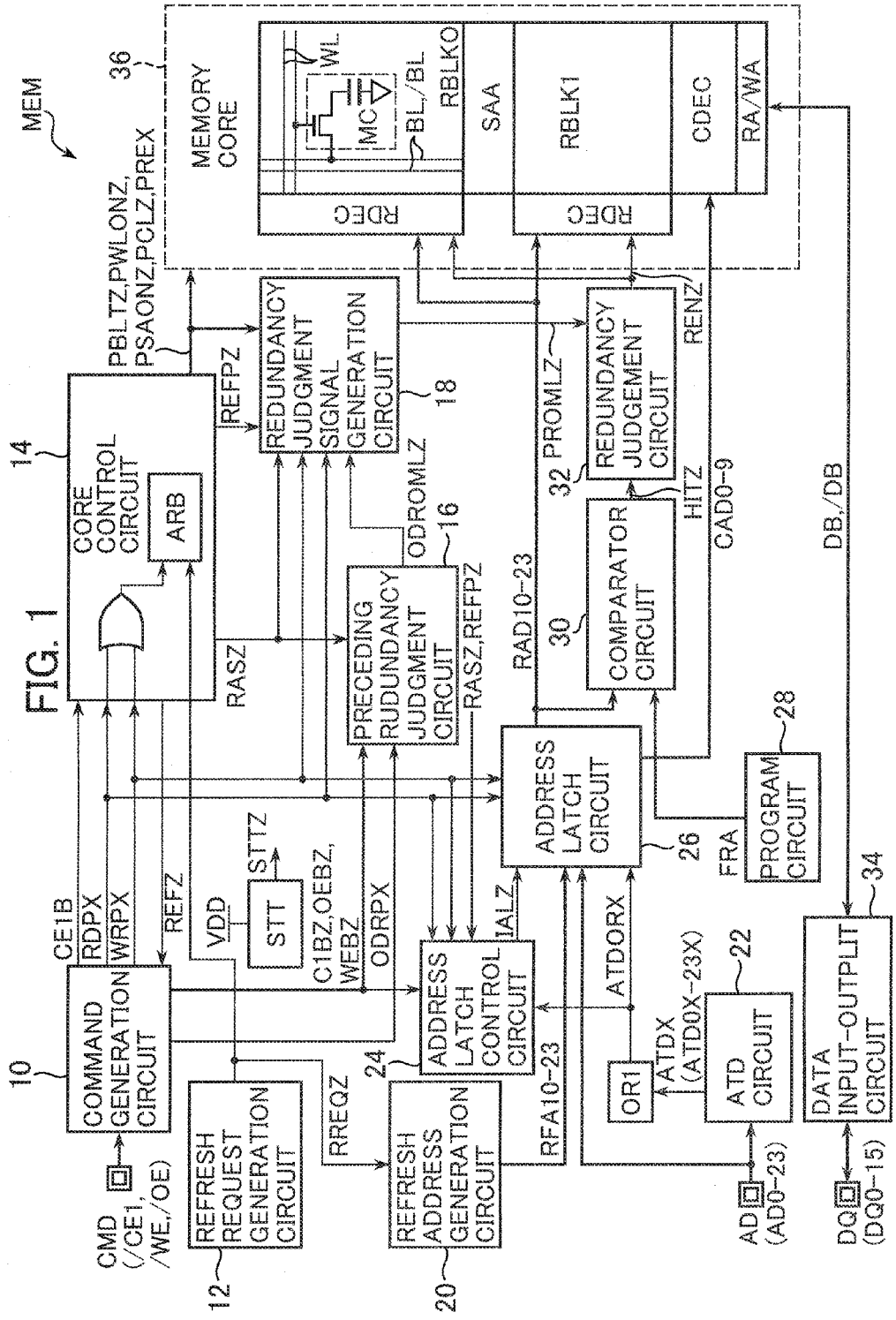
FIG. 1 shows a first embodiment.

Signal lines shown by bold lines in the drawings indicate a plurality of signal lines. In addition, portions of blocks to which the bold lines are connected include a plurality of circuits. The same reference symbols as the corresponding signal names are given to the signal lines through which signals are transmitted. The signals having a "Z" as a suffix indicate a positive logic. The signals having a "slash (/)" as a prefix and the signals having an "X" as a suffix indicate a negative logic. Double squares in the drawings indicate external terminals. For example, the external terminal is a pad on a semiconductor chip or a lead of a package included in the semiconductor chip. The signals supplied via the external terminals have the same reference symbols as those of the terminal names.

FIG. 1 shows a first embodiment. For example, a semiconductor memory MEM in the first embodiment is a Fast Cycle RAM (FCRAM) of a pseudo SRAM type. The pseudo SRAM includes DRAM memory cells (dynamic memory cells) and an SRAM interface. The memory MEM may be a semiconductor memory device sealed in a package or a memory macro (an IP) provided on a system LSI and so on. The memory MEM is a clock asynchronous type, however, the memory MEM may be a clock synchronous type.

The memory MEM includes a command generation circuit 10, a refresh request generation circuit 12, a starter circuit STT, a core control circuit 14, a preceding redundancy judgment circuit 16, a redundancy judgment signal generation circuit 18, a refresh address generation circuit 20, an address transition detection circuit 22 (hereinafter, referred to as an "ATD circuit 22"), an OR circuit OR1, an address latch control circuit 24, an address latch circuit 26, a program circuit 28, a comparator circuit 30, a redundancy judgment circuit 32, a data input-output circuit 34, and a memory core 36.

The command generation circuit 10 decodes a command signal CMD input to an external terminal and outputs a command judgment signal (a read command signal RDPX or a write command signal WRPX) to perform an access operation (for example, a read operation or a write operation) of the memory core 36 and an output prohibition signal ODRPX indicating a period in which an output of a data signal DQ is prohibited. For example, the command signal CMD is an external chip enable signal /CE1, an external write enable signal /WE, an external output enable signal /OE and so on. The output prohibition signal ODRPX is activated during a period after the external chip enable signal /CE1 is activated until the external output enable signal /OE is activated. A chip enable signal C1BZ is output from an input buffer (not shown) receiving the external chip enable signal /CE1 and has the same logic as the external chip enable signal /CE1. A write enable signal WEBZ is output from the input buffer (not shown) receiving the external write enable signal /WE and has the same logic as the external write enable signal /WE. An output enable signal OEBZ is output from the input buffer (not shown) receiving the external output enable signal /OE signal and has the same logic as the external output enable signal /OE. The character "B" in the C1BZ signal, the WEBZ signal, and the OEBZ signal indicates the negative logic which is the same as the "slash (/)".

If the memory MEM has a configuration register or a mode register to set an operation mode, the command generation circuit 10 outputs a register setting command signal to set the registers, in response to the command signal CMD. The register setting command signal to set the configuration register is output if the order and the number of the supplied read command or the supplied write command follow a predetermined rule. The configuration register is set in response to an address signal AD supplied in synchronization with the register setting command signal. The register setting command signal to set the mode register is output upon receiving the command signal CMD having a combination not used in a normal access operation. The mode register is set in response to the address signal AD supplied in synchronization with the register setting command signal.

The refresh request generation circuit 12 periodically generates an internal refresh request RREQZ to automatically perform a refresh operation. The starter circuit STT outputs a starter signal STTZ having a high logic level if an external power supply voltage VDD is lower than a specific value. For example, circuits to be initialized are initialized based on an H level pulse of the starter signal STTZ generated at a power-on time.

The core control circuit 14 outputs a control signal controlling the access operation (the read operation or the write operation) of the memory core 36 or the refresh operation, in response to the read command signal RDPX, the write command signal WRPX, or the refresh request signal RREQZ. The control signal includes a basic timing signal RASZ, a bit control signal PBLTZ, a word control signal PWLONZ, a sense amplifier control signal PSAONZ, a column control signal PCLZ, a pre-charge control signal PREX, and refresh control signals REFZ and REFPZ.

The basic timing signal RASZ and the control signals PBLTZ, PWLONZ, PSAONZ, PCLZ, and PREX are generated at the time of the read operation and the write operation. The basic timing signal RASZ and the control signals PBLTZ, PWLONZ, PSAONZ, PREX, REFZ, and REFPZ are generated at the time of the refresh operation. That is to say, the column control signal PCLZ is not output when the refresh operation is performed. The core control circuit 14 includes an arbiter ARB judging priority of an external access commands (the read command RDPX and the write command WRPX) and the refresh request RREQZ.

The preceding redundancy judgment circuit 16 activates a preceding judgment signal ODROMLZ in response to an activation of both the ODRPX signal and the OEBZ signal when the read command is supplied to the memory MEM.

The redundancy judgment signal generation circuit 18 activates a redundancy judgment signal PROMLZ after a predetermined delay time has elapsed from an input of the read command signal RDPX, the write command signal WRPX, or the refresh control signal REFPZ. In addition, the redundancy judgment signal generation circuit 18 activates the redundancy judgment signal PROMLZ in synchronization with the activation of the preceding judgment signal ODROMLZ. The refresh address generation circuit 20 generates a refresh address signal RFA indicating the memory cell to be refreshed.

The ATD circuit 22 detects transition in logic level of each bit of an external address signal AD and outputs an address transition detection signal ATDX. For example, the external address signal AD includes 24 bits (AD0 to AD23) and the address transition detection signal ATDX also includes 24 bits (ATD0X to ATD23X). The address signals AD0 to AD9 are column address signals and the address signals AD10 to AD23 are row address signals. An address non-multiplex method in which the column address signal and the row address signal are contemporaneously received with different terminals is used by the memory MEM. The column address signal selects a pair of bit lines EL and /EL and the row address signal selects a word line WL. The OR circuit OR1 performs an OR operation (the negative logic) of the address transition detection signals ATD0X to ATD23X and outputs an address transition detection signal ATDORX.

The address latch control circuit 24 deactivates an internal address latch signal IALZ in synchronization with the activation of the address transition detection signal ATDORX. In addition, the address latch control circuit 24 deactivates the internal address latch signal IALZ in synchronization with the activation of the read command signal RDPX, or the write command signal WRPX. The address latch control circuit 24 activates the internal address latch signal IALZ while the address transition detection signal ATDORX, the read command signal RDPX or the write command signal WRPX is being deactivated. Moreover, the address latch control circuit 24 activates the internal address latch signal IALZ during activation of the refresh control signal REFPZ. The refresh address signal RFA is supplied to the memory core 36 as a row address signal RAD and the external address signal AD is supplied to the memory core 36 as the row address signal RAD, while the internal address latch signal IALZ is being deactivated.

The address latch circuit 26 outputs the address signal AD as the row address signal RAD or as a column address signal CAD during the activation of the address transition detection signal ATDORX, the read command signal RDPX, or the write command signal WRPX. The address latch circuit 26 latches the address signal AD in synchronization with the deactivation of the address transition detection signal ATDORX, the read command signal RDPX, or the write command signal WRPX. The address latch circuit 26 outputs the refresh address signal RFA as the row address signal RAD during the activation of the internal address latch signal IALZ. The address latch circuit 26 latches the refresh address signal RFA in synchronization with the deactivation of the internal address latch signal IALZ.

The program circuit 28 stores the row address signals RAD10 to RAD23 indicating a defective word line WL with a fuse program incorporated therein.

Figure 8:
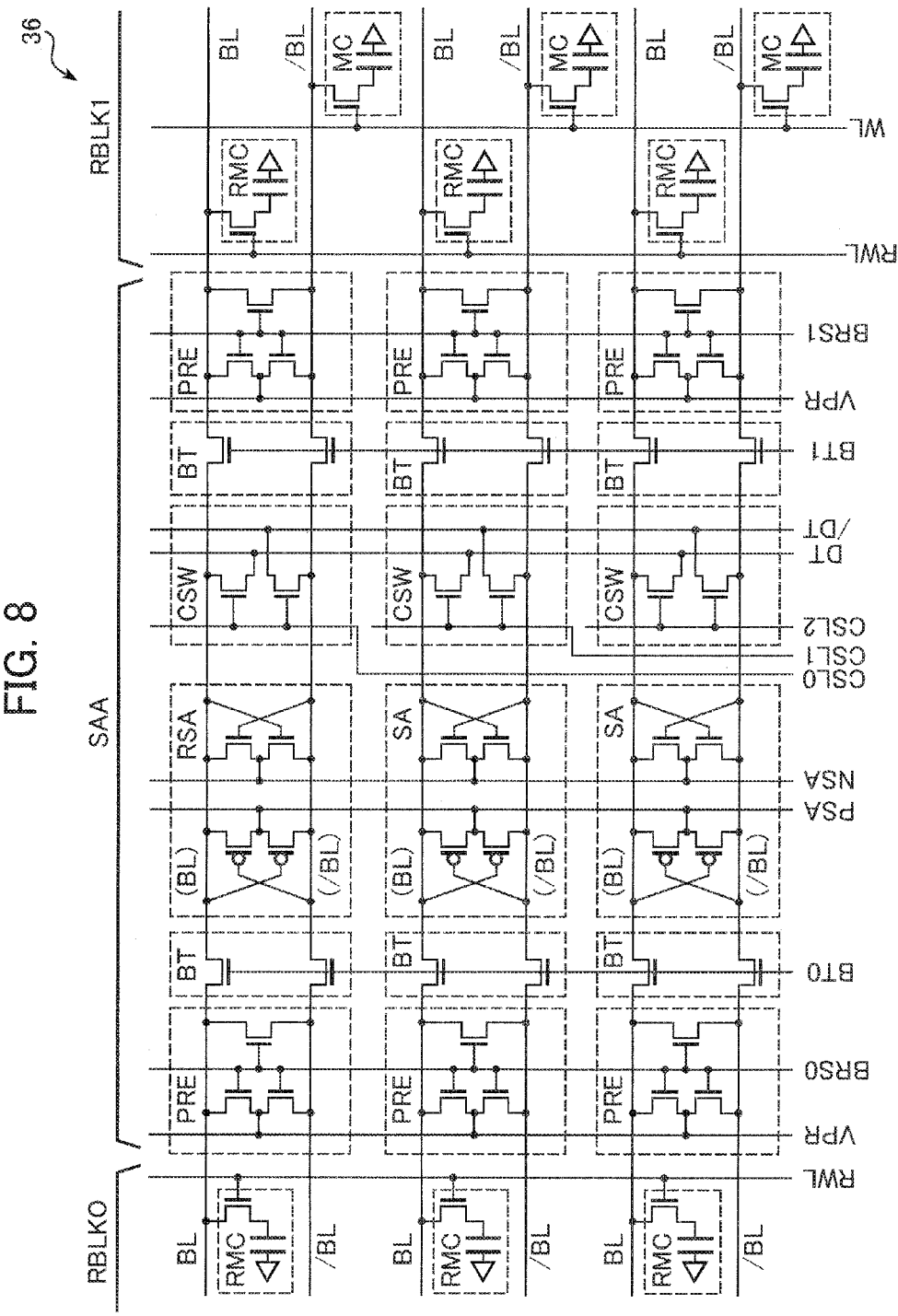
FIG. 8 shows a sense amplifier area according to the first embodiment.

The program circuit 28 outputs the stored row address signals RAD10 to RAD23 as fuse row address signals FRA10 to FRA23. The memory MEM includes a row redundancy circuit (a redundancy memory cell RMC, redundancy word line RWL or the like as shown in FIG. 8) that relieves defects in units of word lines WL. However, the memory MEM may include a column redundancy circuit that relieves the defects in units of the pair of bit lines BL and /BL. The memory MEM may include the plurality of program circuits 28, the plurality of comparator circuits 30, and the plurality of redundancy judgment circuits 32 in order to relieve the plurality of word lines WL. The program circuit 28 may include a non-volatile memory cell or the like.

The comparator circuit 30 compares the input address AD signals (RAD10 to RAD23) supplied together with the read command or the write command with redundancy address signals (the fuse row address signals FRA10 to FRA23) bit-by-bit. The comparator circuit 30 activates a hit signal HITZ if all of bit values coincide with each other.

The redundancy judgment circuit 32 activates a redundancy enable signal RENZ (a result of a redundancy judgment) in synchronization with the activation of the redundancy judgment signal PROMLZ when the hit signal HITZ is being deactivated. The redundancy judgment circuit 32 holds a deactivated state of the redundancy enable signal RENZ when the hit signal HITZ is being deactivated.

Based on the activation of the redundancy enable signal RENZ, activation of a real word line WL is prohibited and the redundancy word line RWL (FIG. 8) is activated. Based on the activation of the redundancy word line RWL, the real word line WL corresponding to the defect is replaced by the redundancy word line RWL and the defect is relieved. The redundancy judgment circuit 32 judges whether the redundancy memory cell RMC is used or not, based on a result of a comparison by the comparator circuit 30 and on the redundancy judgment signal PROMLZ.

The data input-output circuit 34 receives read data read from a memory cell MC via complementary data bus lines DB and /DB at the time of the read operation, and then the data input-output circuit 34 outputs the read data received to a data terminal DQ (for example, 16 bits). The data input-output circuit 34 receives the write data signal supplied to the data terminal DQ at the time of the write operation, and the data input-output circuit 34 outputs the received data signal to the data bus lines DB and /DB.

For example, the memory core 36 includes a pair of row blocks RBLK0 and RBLK1, a row decoder RDEC corresponding to respective row blocks RBLK0 and RBLK1, a sense amplifier area SAA provided between the row block RBLK0 and the row block RBLK1, a column decoder CDEC, a read amplifier RA, and a write amplifier WA. The number of row blocks RBLK may be four, eight, sixteen or the like. The respective row blocks RBLK0 and RBLK1 include a plurality of dynamic memory cells MC arranged in a matrix form, a plurality of word lines WL coupled to the rows of the memory cells MC arranged in a lateral direction in FIG. 1, and the plurality of pair of bit lines BL and /BL coupled to columns of the memory cells MC arranged in a longitudinal direction in FIG. 1. The memory cell MC includes a capacitor that stores data as an electrical charge and a transfer transistor that couples one end of the capacitor to the bit line BL (or /BL). Another end of the capacitor is coupled to a reference voltage line.

For example, the column decoder CDEC activates any of the column selection signals CSL (FIG. 8) in response to a column address signals CAD0 to CAD9 to an H level in order to select the number of the pair of bit lines BL and /BL corresponding to the number of bits of the data terminal DQ. The read amplifier RA amplifies complementary read data output via a column switch CSW (FIG. 8) and outputs the read data to the data bus lines DB and /DB, at the time of the read operation. The write amplifier WA amplifies complementary write data supplied via the data bus lines DB and /DB and supplies the write data to the pair of bit lines BL and /BL, at the time of the write operation.

Figure 2:
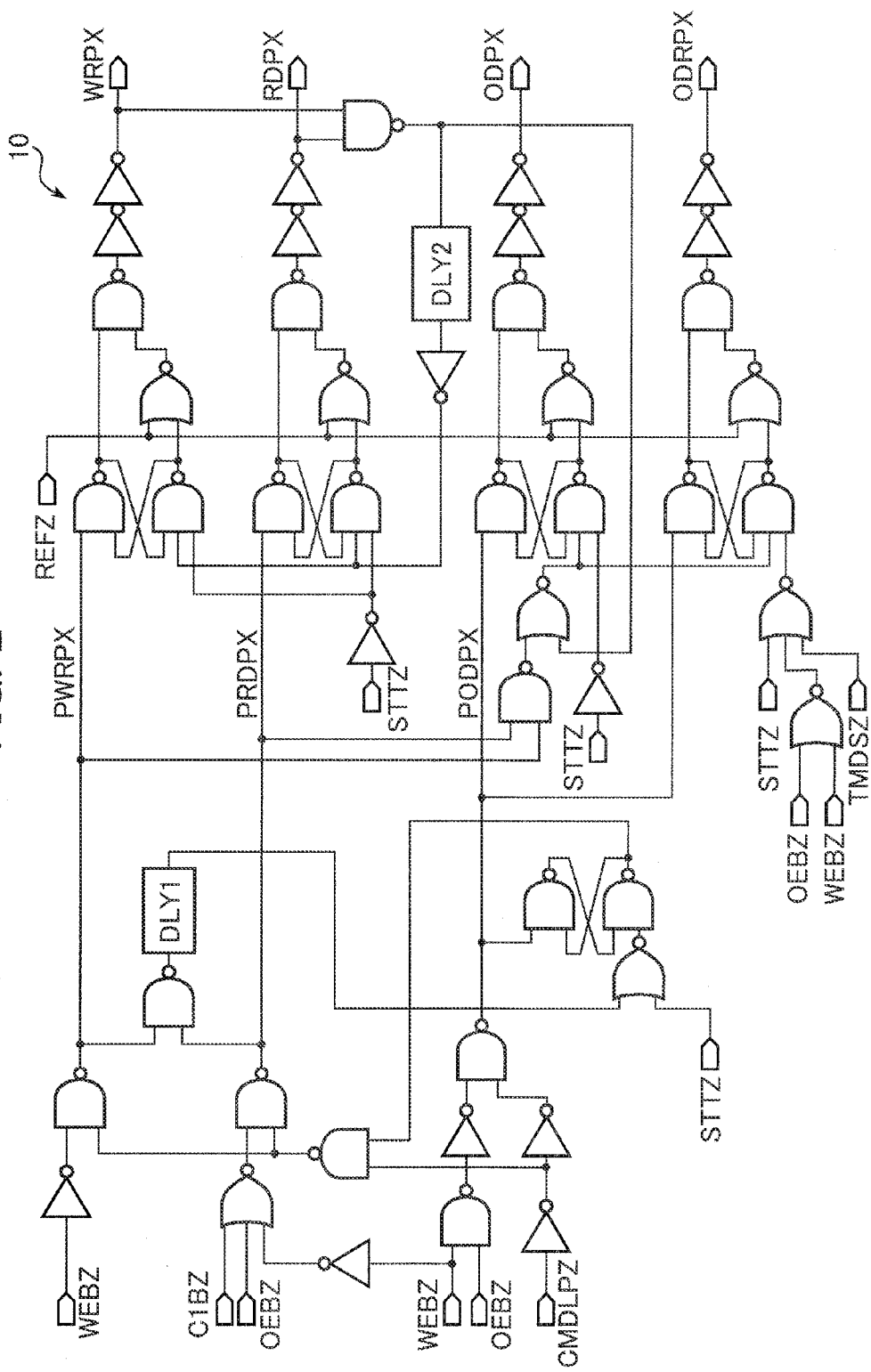
FIG. 2 shows a command generation circuit according to the first embodiment.

FIG. 2 shows the command generation circuit 10 in FIG. 1. An output prohibition pulse signal PODPX is generated in synchronization with a command latch pulse signal CMDLPZ generated by the command generation circuit 10 after a predetermined period has elapsed from the activation of the external chip enable signal /CE1. A write command pulse signal PWRPX is activated in synchronization with the activation of the external write enable signal /WE.

A read command pulse signal PRDPX is activated in synchronization with the activation of the external output enable signal /OE. Activation periods of the pulse signals PWRPX and PRDPX are substantially equal to a delay time of a delay circuit DLY1.

The output prohibition signals ODPX and ODRPX are activated in synchronization with the activation of the output prohibition pulse signal PDOPX. The output prohibition signals ODPX and ODRPX are deactivated in synchronization with the activation of the write command pulse signal PWRPX or the read command pulse signal PRDPX. Activation of a flip-flop which generates the output prohibition signal ODRPX is prohibited during activation of the starter signal STTZ, activation of a test mode signal TMDSZ, or activation of both the output enable signal OEBZ (=/OE) and the write enable signal WEBZ (=/WE).

The write command signal WRPX is activated in synchronization with the activation of the write command pulse signal PWRPX. The read command signal RDPX is activated in synchronization with the activation of the read command pulse signal PRDPX. Activation periods of the read command signal WRPX and the read command signal RDPX are substantially equal to a delay time of a delay circuit DLY2. Four NOR gates which receives the refresh control signal REFZ function as prohibition circuits which prohibit the write command signal WRPX, the read command signal RDPX, and the output prohibition signals ODPX and ODRPX from being activated, during the refresh operation. An H level of the refresh control signal REFZ indicates a period of the refresh operation.

Figure 3:
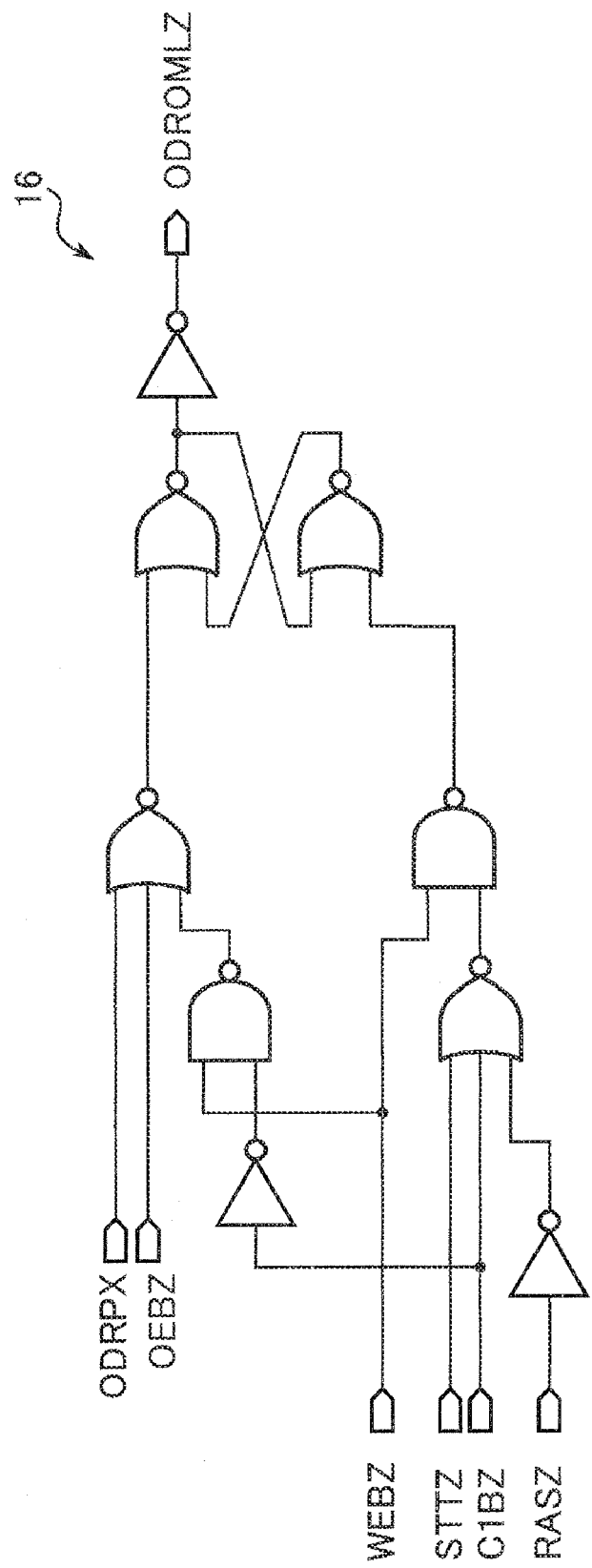
FIG. 3 shows a preceding redundancy judgment circuit according to the first embodiment.

FIG. 3 shows the preceding redundancy judgment circuit 16 in FIG. 1.

The preceding redundancy judgment circuit 16 activates the preceding judgment signal ODROMLZ upon activation of the output enable signal OEBZ during the activation of the output prohibition signal ODRPX. A three-input NOR gate which receives the output prohibition signal ODRPX and the output enable signal OEBZ detects a command signal which indicates that both the output prohibition signal ODRPX and the output enable signal OEBZ are activated.

The redundancy judgment signal PROMLZ is activated based on the activation of the preceding judgment signal ODROMLZ. The preceding redundancy judgment circuit 16 controls output timing of the redundancy judgment signal PROMLZ based on an L level of the command signal /CE1 and an L level of the command signal /OE.

The preceding redundancy judgment circuit 16 deactivates the preceding judgment signal ODROMLZ in synchronization with the activation of the starter signal STTZ, activation of the chip enable signal C1BZ (=/CE1), or deactivation of the basic timing signal RASZ. Upon supply of the write command, the two NAND gates, which receive the write enable signal WEBZ, prohibit the preceding judgment signal ODROMLZ from being activated.

Figure 4:
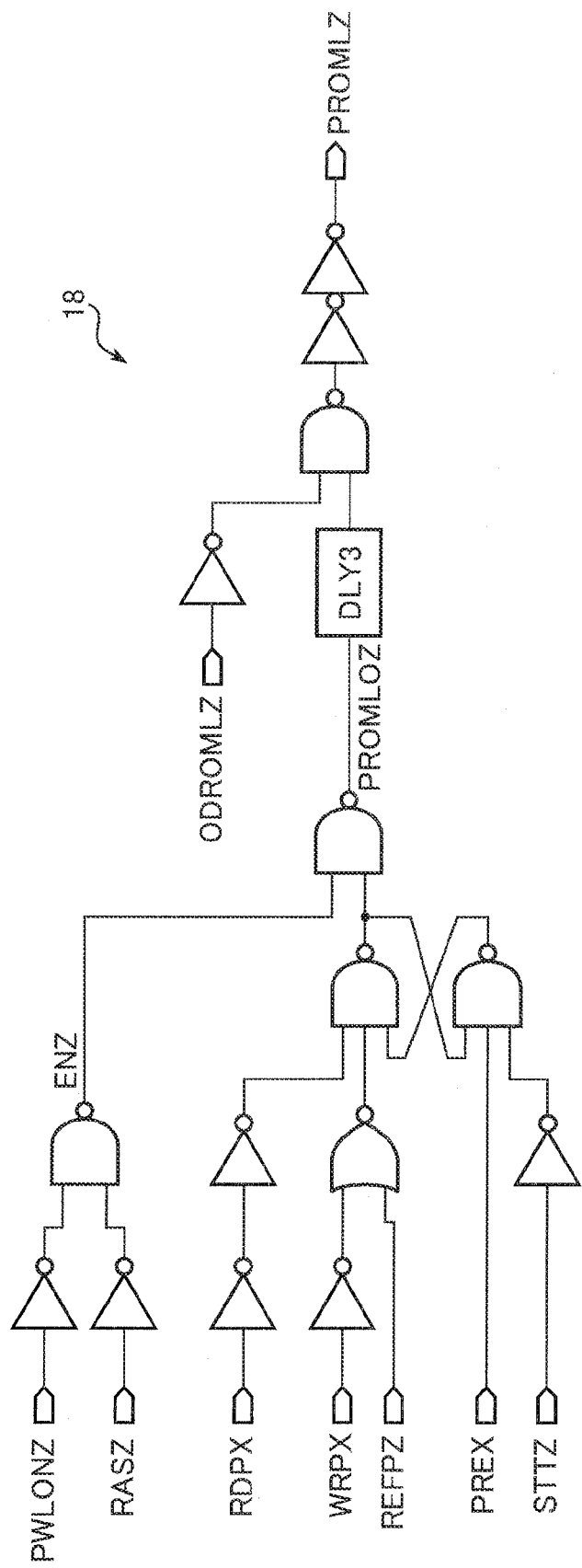
FIG. 4 shows a redundancy judgment signal generation circuit according to the first embodiment.

FIG. 4 shows the redundancy judgment signal generation circuit 18 in FIG. 1. The redundancy judgment signal generation circuit 18 activates a second redundancy judgment signal PROMLOZ in synchronization with the activation of the read command signal RDPX, the write command signal WRPX, or the refresh control signal REFPZ. The redundancy judgment signal generation circuit 18 activates the redundancy judgment signal PROMLZ after a delay time of a delay circuit DLY3 has elapsed from activation of the second redundancy judgment signal PROMLOZ. The redundancy judgment signal generation circuit 18 activates the redundancy judgment signal PROMLZ in synchronization with the activation of the preceding judgment signal ODROMLZ. The redundancy judgment signal PROMLZ is activated in synchronization with the write command signal WRPX at the time of the write operation in response to the write command. Furthermore, the redundancy judgment signal PROMLZ is activated in synchronization with the refresh control signal REFPZ at the time of the refresh operation in response to the refresh request signal RREQZ and activated in synchronization with the preceding judgment signal ODROMLZ at the time of the read operation in response to the read command. When the external output enable signal /OE1 is activated substantially contemporaneously with the external chip enable signal /CE1, in other words, when there is no data output prohibition period described below and the preceding judgment signal ODROMLZ is not activated, the redundancy judgment signal PROMLZ is activated in synchronization with the read command signal RDPX.

Upon the supply of the write command or the refresh request signal RREQZ, the delay circuit DLY3 delays the redundancy judgment signal PROMLZ compared with the read operation. It is only necessary that write data be written in the real memory cell MC or the redundancy memory cell RMC within a write cycle time, during the write operation. In consequence, it is only necessary that a redundancy judgment be made in response to the activation of the write command signal WRPX. Since the read amplifier RA, the write amplifier WA, and the data input-output circuit 34 do not operate in the refresh operation, the memory core 36 has some surplus in terms of the operation thereof. Thus, it is only necessary that the redundancy judgment be made in response to the activation of the refresh request signal RREQZ.

The redundancy judgment signal generation circuit 18 deactivates the redundancy judgment signal PROMLZ in synchronization with the activation of a pre-charge control signal PREX. The refresh control signal REFPZ is temporarily activated upon start of the refresh operation. Enable signal ENZ is activated during the activation of the word control signal PWLONZ or the activation of the basic timing signal RASZ. The activation of the redundancy judgment signal PROMLZ by the RDPX signal, the WRPX signal, or the REFPZ signal is performed during the activation of the enable signal ENZ.

Figure 10:
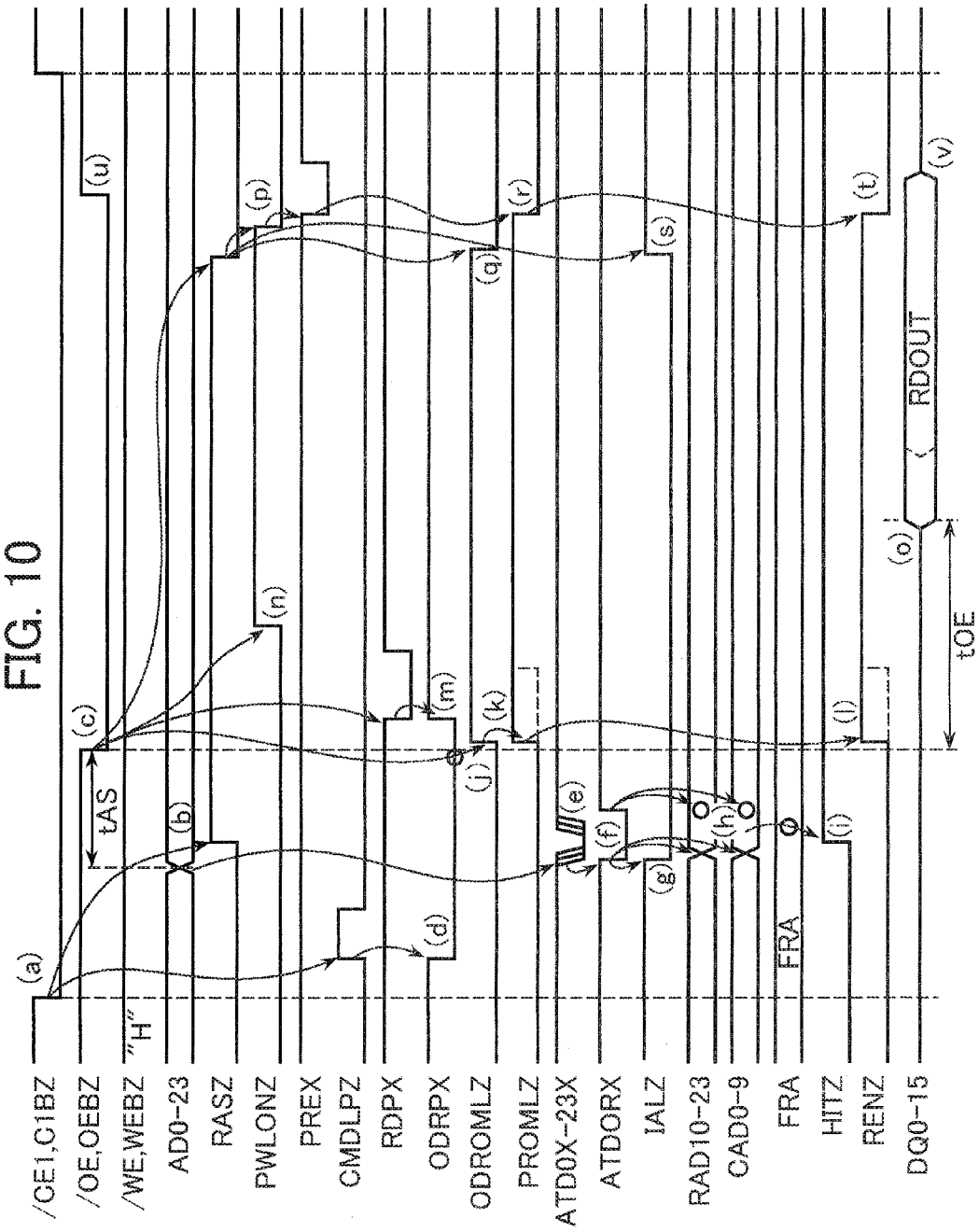
FIG. 10 shows a read operation according to the first embodiment.

As shown in FIG. 10, the redundancy judgment signal PROMLZ is activated substantially contemporaneously with the activation of the output enable signal /OE by activating the redundancy judgment signal PROMLZ in synchronization with the preceding judgment signal ODROMLZ. In consequence, the redundancy judgment circuit 32 activates the redundancy enable signal RENZ early. Since the judgment on whether to use the real word line WL or to use the redundancy word line RWL is made early, an access time at the time of the read operation maybe reduced. Especially, an access time tOE taken from the activation of the output enable signal /OE until an output of the read data is reduced.

Figure 5:
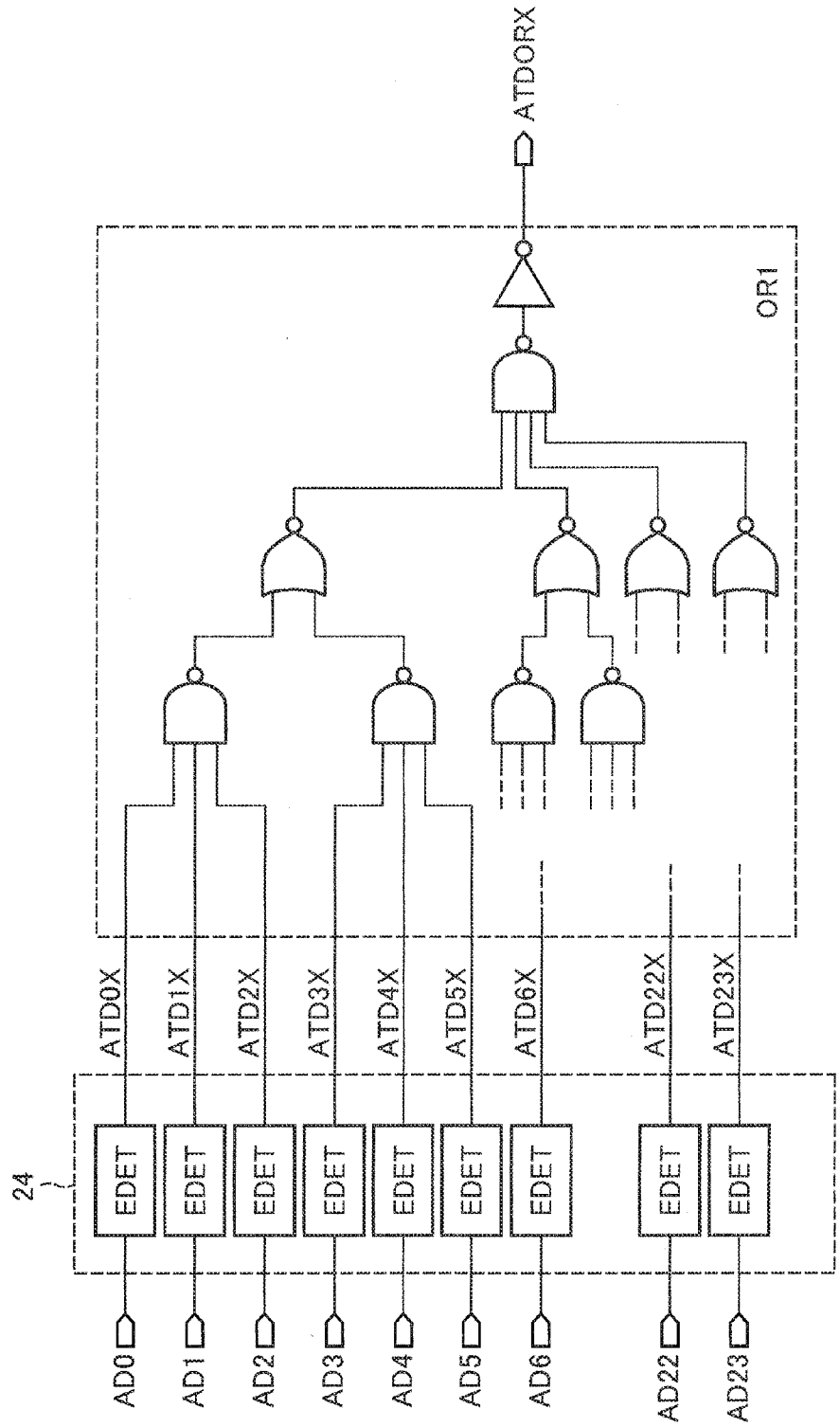
FIG. 5 shows an ATD circuit and an OR circuit according to the first embodiment.

FIG. 5 shows the ATD circuit 22 and the OR circuit OR1 in FIG. 1. The ATD circuit 22 includes edge detection circuits EDET that correspond to each bit of the address signals AD0 to AD23. Each of the edge detection circuits EDET temporarily activates each of the address transition detection signals ATDX (ATD0X to ATD23X) in synchronization with a transition edge (a rising edge or a falling edge) of the address signal AD.

OR circuit OR1 outputs an OR logic of the address transition detection signals ATD0X to ATD23X as an address transition detection signal ATDORX. The address transition detection signal ATDORX is temporarily activated at least upon a change in any of the logic levels of the address signals AD0 to AD23.

Figure 6:
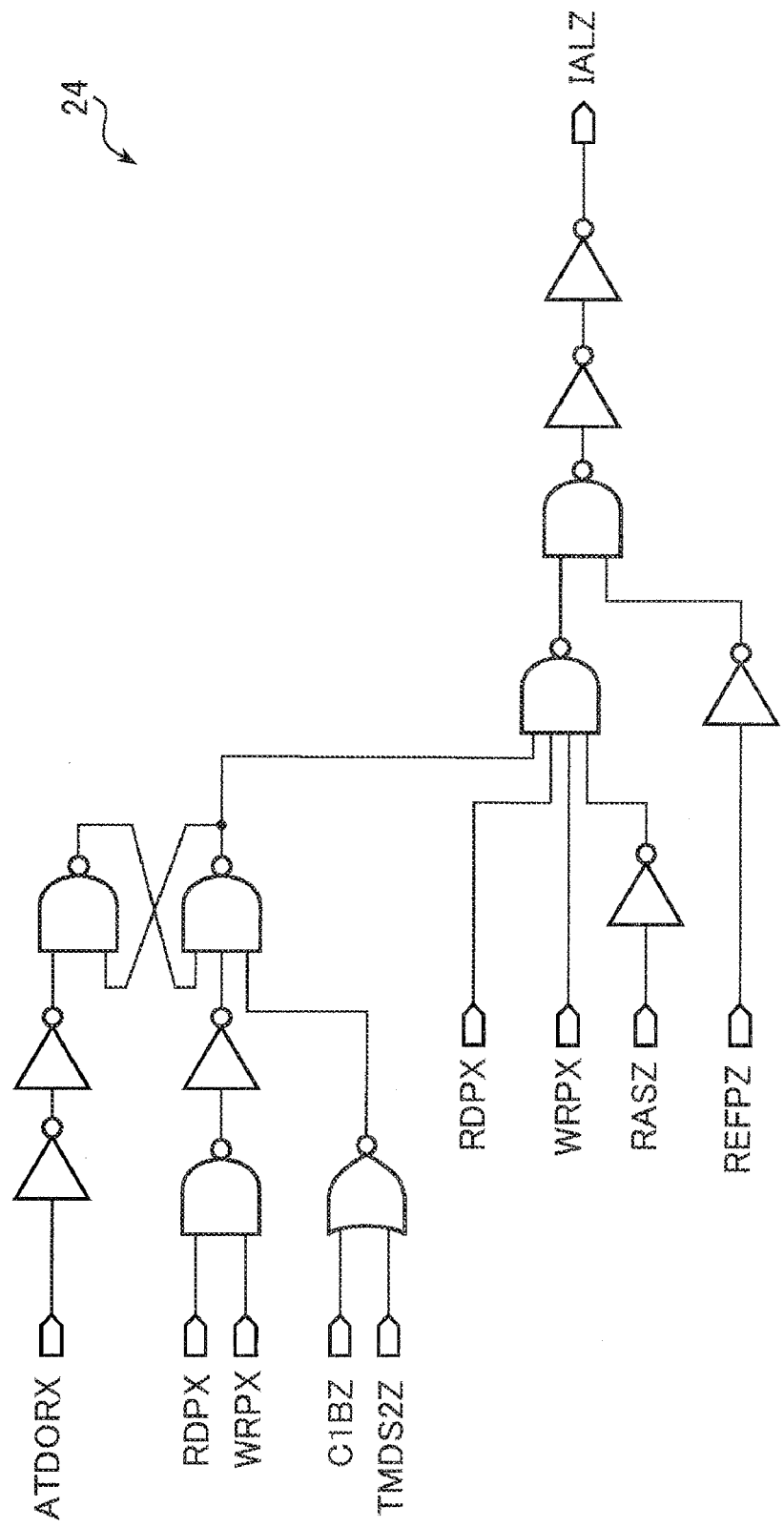
FIG. 6 shows an address latch control circuit according to the first embodiment.

FIG. 6 shows the address latch control circuit 24 in FIG. 1. The address latch control circuit 24 deactivates the internal address latch signal IALZ in synchronization with the activation of the read command signal RDPX, the write command signal WRPX, the basic timing signal RASZ, or the address transition detection signal ATDORX during the activation of the chip enable signal C1BZ. The deactivation of the internal address latch signal IALZ by the address transition detection signal ATDORX is prohibited during the activation of a test mode signal TMDS2Z.

Upon the deactivation of the read command signal RDPX, the write command signal WRPX, and the basic timing signal RASZ, the address latch control circuit 24 activates the internal address latch signal IALZ. The address latch control circuit 24 forcibly activates the internal address latch signal IALZ during the activation of the refresh control signal REFPZ.

Figure 7:
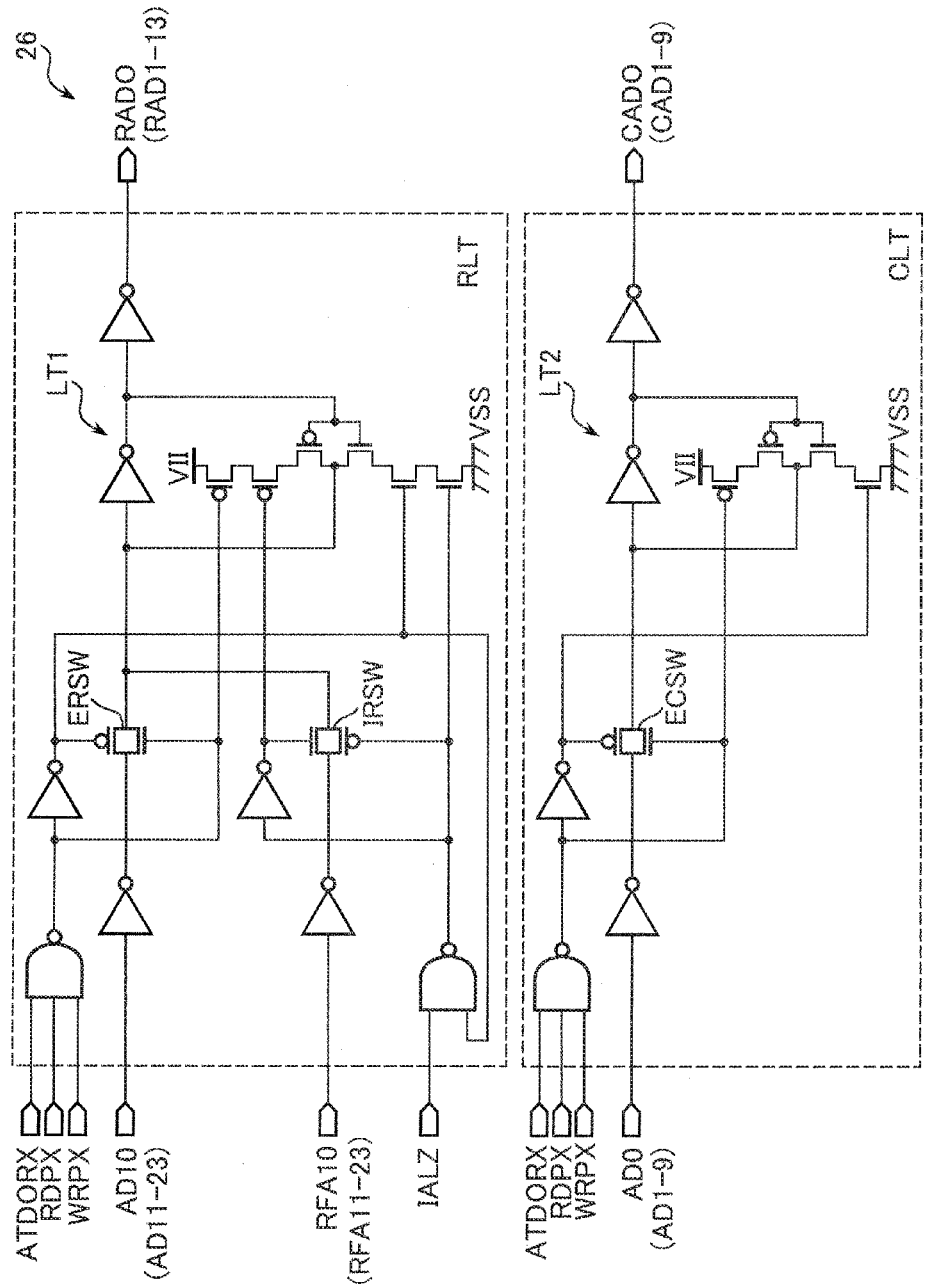
FIG. 7 shows an address latch circuit according to the first embodiment.

FIG. 7 shows the address latch circuit 26 in FIG. 1. A reference symbol VII shows an internal power supply voltage generated by using the external power supply voltage VDD. The internal power supply voltage VII is generated by an internal voltage generation circuit (not shown) and is a constant voltage lower than the external power supply voltage VDD. The internal power supply voltage VII is supplied to a circuit block other than an input buffer and an output buffer. The address latch circuit 26 includes a row latch circuit RLT that latches the address signal AD (AD11 to AD23) or the refresh address signal RFA (RFA11 to RFA23) and a column latch circuit CLT that latches the address signal AD (AD1 to AD9). The row latch circuit RLT is formed with respect to each bit of the address signals AD10 to AD23 (the row address signal).

The column latch circuit CLT is formed with respect to each bit of the address signals AD1 to AD9 (the column address signal). A three-input NAND gate which receives the address transition detection signal ATDORX, the read command signal RDPX, and the write command signal WRPX may be provided in common with the row latch circuit RLT and the column latch circuit CLT.

The row latch circuit RLT includes an external row switch ERSW, an internal row switch IRSW, and a latch LT1. The external row switch ERSW is switched ON during the activation (an L level) of the address transition detection signal ATDORX, the read command signal RDPX, or the write command signal WRPX. The internal row switch IRSW is switched ON, both during the deactivation of the address transition detection signal ATDORX, the read command signal RDPX, or the write command signal WRPX and during the activation (an H level) of the internal address latch signal IALZ. The latch LT1 latches the external address signal AD or the refresh address signal RFA. For example, the external row switch ERSW and the internal row switch IRSW each include a CMOS transfer gate.

The address signals AD10 to AD23 supplied via the external row switch ERSW and the refresh address signals RFA10 to RFA23 supplied via the internal row switch IRSW are output as the row address signals RAD10 to RAD23. The latch LT1 latches the address signals AD10 to AD23 or the refresh address signals RFA10 to RFA23 in synchronization with the deactivation of the signals ATDORX, RDPX, WRPX, or IALZ. The row latch circuit RLT functions as an address selector to supply the row decoder RDEC with any one of the external address signal AD (RAD) and the refresh address signal RFA.

The column latch circuit CLT includes an external column switch ECSW and a latch LT2. The external column switch ECSW is switched ON during the activation (the L level) of the address transition detection signal ATDORX, the read command signal RDPX, or the write command signal WRPX. The latch LT2 latches the external address signals AD0 to AD9. For example, the external column switch ECSW includes a CMOS transfer gate. The address signals AD0 to AD9 supplied via the external column switch ECSW are output as the column address signal CAD0 to CAD9. The latch LT2 latches the address signals AD0 to AD9 in synchronization with the deactivation of the signals ATDORX, RDPX, or WRPX.

FIG. 8 shows the sense amplifier area SAA in FIG. 1. FIG. 8 shows part of the sense amplifier area SAA corresponding to data terminal DQ. If the memory MEM has the data terminal DQ of 16 bits, the sense amplifier area SAA is provided with respect to each data terminal DQ. The sense amplifier area SAA includes a pre-charge circuit PRE and a coupling switch ET, which correspond to each of the row blocks RBLK0 and RBLK1, and a sense amplifier SA and a column switch CSW, which are shared by the row blocks RELK0 and RBLK1.

Pre-charge control signals BRS0 and BRS1 that control the pre-charge circuit PRE is generated in synchronization with the pre-charge control signal PREX. The coupling switch BT selectively couples the pair of bit lines BL and /BL of each of the row blocks RBLK0 and RBLK1 to the sense amplifier SA.

Control signals BT0 and BT1 that controls the coupling switch BT are generated in synchronization with the bit control signal PBLTZ.

Each column switch CSW is switched ON when a column selection signal CSL0 (or CSL1 and CLS2) is at an L level and allows the sense amplifier SA and the pair of bit lines BL and /BL are coupled to data lines DT and /DT.

The column selection signals CSL0 to CSL2 are generated in synchronization with the column control signal PCLZ. For example, the data lines DT and /DT are wired with respect to each of the pair of row blocks RBLK0 and RBLK1 and wired in common with respect to each bit of the data terminal DQ. Sense amplifier activation signals PSA and NSA that control the sense amplifier SA are generated in synchronization with the sense amplifier control signal PSAONZ.

The real memory cell MC is coupled to the real word line WL and to the bit line BL or the bit line /BL in each of the row blocks RBLK0 and RBLK1.

The redundancy memory cell RMC is coupled to the redundancy word line RWL and to the bit line BL or the bit line /BL. The real word line WL and the redundancy word line RWL are activated in synchronization with the word control signal PWLONZ. The sense amplifier area SAA may be the same as a sense amplifier area of a commonly used DRAM.

Figure 9:
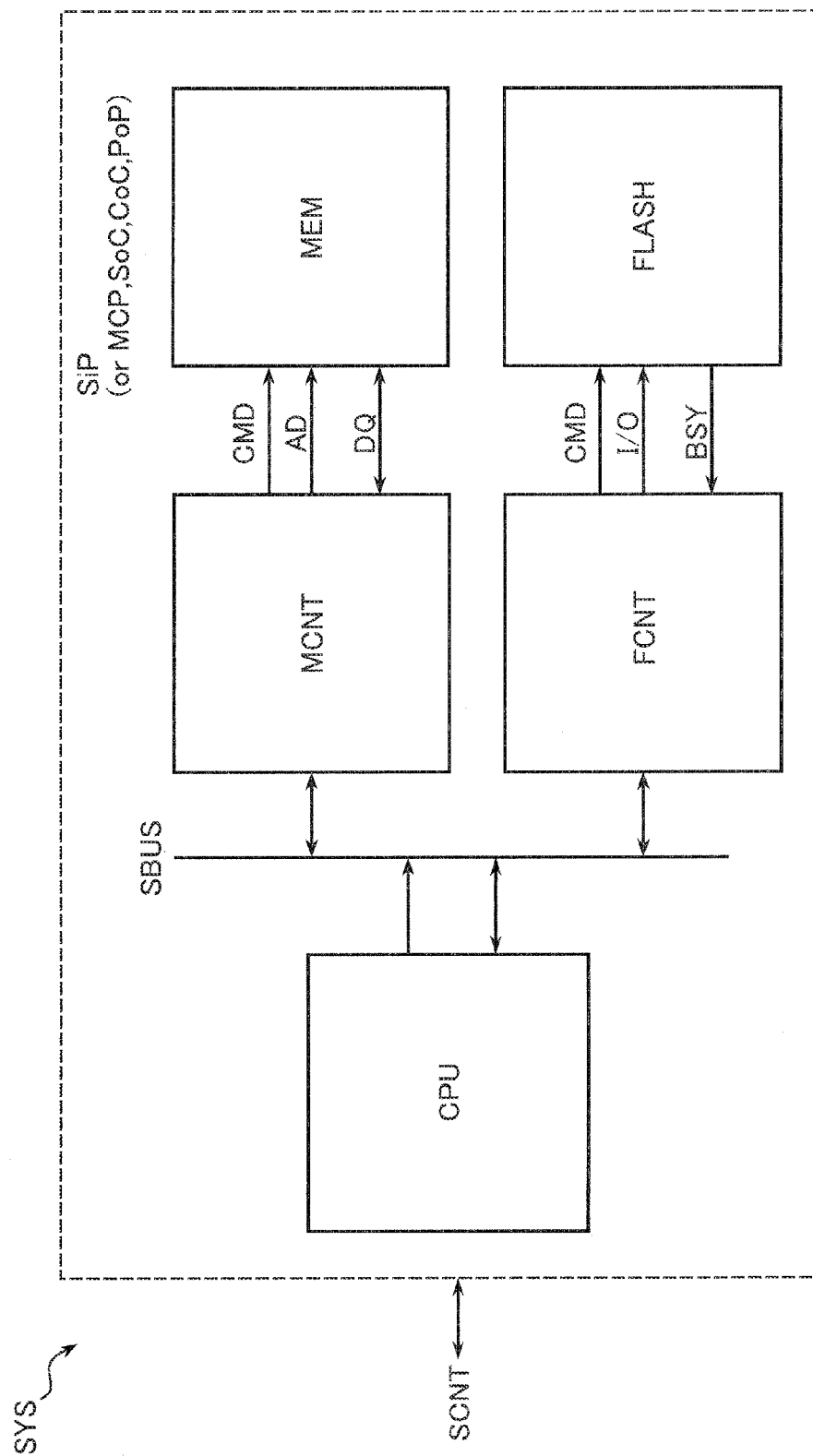
FIG. 9 shows a system on which a memory in the first embodiment is provided.

FIG. 9 shows the system SYS on which the memory in FIG. 1 is provided. For example, the system SYS is a part of a portable device such as a mobile telephone or the like. The system shown in FIG. 9 is applicable to embodiments disclosed below. The system SYS includes a system-in-package SiP in which a plurality of chips are provided on a package substrate such as a lead frame or the like. The system SYS includes a multi-chip package MCP in which the plurality of chips are stacked on a package substrate. The system SYS includes a system-on-chip (SoC) in which a plurality of macros are provided on a silicon substrate. The system SYS may include a chip-on-chip (CoC) or a package-on-package (PoP).

The SiP includes the memory MEM in FIG. 1, a memory controller MCNT which accesses the memory MEM, a flash memory FLASH, a memory controller FCNT which accesses the flash memory FLASH, and a CPU which controls the entire system.

The CPU, the memory controllers MCNT and FCNT are coupled with each other via a system bus SBUS. The SiP is coupled via an external bus SCNT to an upper system. The CPU outputs a command signal and an address signal to the memory controller MCNT to perform the read operation of the memory MEM and receives a read data signal from the memory controller MCNT. The CPU outputs the command signal, the address signal, and a write data signal to the memory controller MCNT to perform the write operation of the memory MEM. The CPU outputs the command signal, the address signal, and the write data signal to the memory controller FCNT in order to perform an access operation (the read operation, a program operation, or an erase operation) of the flash memory FLASH.

The CPU receives the read data signal from the memory controller FCNT.

The memory controller MCNT outputs the command signal CMD, the address signal AD, and a write data signal DQ to the memory MEM, based on the command signal, the address signal, and the write data signal from the CPU. The memory controller MCNT outputs the read data signal DQ from the memory MEM to the CPU. The memory controller FCNT performs the same operation. The command signal CMD and the address signal AD are used for performing the read operation and the write operation of the memory MEM by the CPU and may be directly output to the memory MEM without providing the memory controller MCNT in the system SYS.

FIG. 10 shows the read operation in the first embodiment. The external chip enable signal /CE1, the external output enable signal /OE, the external write enable signal /WE, and the address signal AD are output from the CPU via the memory controller MCNT in FIG. 9. The CPU may directly output the external chip enable signal /CE1, the external output enable signal /OE, the external write enable signal /WE, and the address signal AD to the memory MEM.

The external chip enable signal /CE1 is activated, the address signal AD for the read operation is supplied to the memory MEM, and the external output enable signal /OE is activated at last (FIG. 10 (a, b, and c)). The read command is recognized based upon an L level of the external chip enable signal /CE1 and on an L level of the external output enable signal /OE. A setup time tAS of the address signal AD with respect to a falling edge of the external output enable signal /OE is set to a predetermined time period (for example, 5 ns (nanoseconds)). The external write enable signal /WE is held at an H level. The row address signal RAD among the address signals AD is a defective address stored in the program circuit 28 in FIG. 1. The redundancy word line RWL is selected instead of the real word line WL.

The command generation circuit 10 in FIG. 2 activates the output prohibition signal ODRPX to an L level in synchronization with the command latch pulse signal CMDLPZ generated by the activation of the external chip enable signal /CE1 (FIG. 10(d)). An L level period of the output prohibition signal ODRPX indicates a period in which an output of the data signal DQ is prohibited in the activation period of the external chip enable signal /CE.

The ATD circuit 22 in FIG. 5 activates the address transition detection signals ATD0X to ATD23X to an L level for a predetermined period in response to a change in the address signal AD (FIG. 10(e)). A plurality of diagonal lines on the waveform of the address transition detection signals ATD0X to ATD23X in FIG. 10 indicates a skew of the address signal AD. The OR circuit OR1 in FIG. 5 activates the address transition detection signal ATDORX to the L level for the period in which any of the address transition detection signals ATD0X to ATD23X is at the L level (FIG. 10(f)). The address latch control circuit 24 in FIG. 6 deactivates the internal address latch signal IALZ in synchronization with the activation of the address transition detection signal ATDORX (FIG. 10(g)).

The address latch circuit 26 shown in FIG. 7 outputs the address signal AD as the row address signal RAD and the column address signal CAD for the period in which the address transition detection signal ATDORX is at the L level and latches the row address signal RAD and the column address signal CAD in synchronization with the deactivation (a rising edge) of the address transition detection signal ATDORX (FIG. 10(h)). The comparator circuit 30 in FIG. 1 detects a coincidence between the row address signal RAD and the fuse row address signal FRA and activates the hit signal HITZ (FIG. 10(i)).

The preceding redundancy judgment circuit 16 in FIG. 3 activates the preceding judgment signal ODROMLZ in synchronization with the activation of the external output enable signal /OE before the read command signal RDPX is activated (FIG. 10(j)). The redundancy judgment signal generation circuit 18 in FIG. 4 activates the redundancy judgment signal PROMLZ in synchronization with the activation of the preceding judgment signal ODROMLZ before the read command signal RDPX is activated (FIG. 10(k)). Thus the redundancy judgment circuit 32 in FIG. 1 activates the redundancy enable signal RENZ in synchronization with the activation of the external output enable signal /OE (FIG. 10(l)).

After the activation of the redundancy enable signal RENZ, the read command signal RDPX is activated and the output prohibition signal ODRPX is deactivated (FIG. 10(m)). That is to say, the data output prohibition period is terminated. The core control circuit 14 in FIG. 1 outputs the control signals such as the word control signal PWL0NZ or the like in sequence, in response to the activation of the read command signal RDPX (FIG. 10(n)). Then the memory core 36 starts the read operation.

The redundancy judgment is made before the read command signal RDPX is activated. In other words, the redundancy judgment after the activation of the external output enable signal /OE is not necessary. For the above reason, the read operation of the memory core 36 is started early and a read data signal RDOUT from the redundancy memory cell RMC is output early to the data terminal DQ (FIG. 10(o)). In consequence, the access time tOE from the activation of the external output enable signal /OE until the output of the read data is reduced.

After a predetermined period has elapsed from the activation of the external output enable signal /OE, the basic timing signal RASZ is deactivated, the word control signal PWL0NZ is deactivated, and the pre-charge control signal PREX is temporarily activated (FIG. 10(p)). Then the pair of bit lines BL and /BL are pre-charged with a pre-charge voltage VPR.

The preceding redundancy judgment circuit 16 in FIG. 1 deactivates the preceding judgment signal ODROMLZ in synchronization with the deactivation of the basic timing signal RASZ (FIG. 10(q)). The redundancy judgment signal generation circuit 18 in FIG. 1 deactivates the redundancy judgment signal PROMLZ in synchronization with the activation of the pre-charge control signal PREX (FIG. 10(r)). The address latch control circuit 24 in FIG. 1 activates the internal address larch signal IALZ in synchronization with the deactivation of the basic timing signal RASZ (FIG. 10(s)). The redundancy judgment circuit 32 in FIG. 1 deactivates the redundancy enable signal RENZ in synchronization with the deactivation of the redundancy judgment signal PROMLZ (FIG. 10(t)).

Thereafter the external output enable signal /OE is deactivated (FIG. 10(u)) and the output of the read data signal RDOUT is stopped (FIG. 10(v)), so that the read operation is completed. When the external output enable signal /OE is again activated during the activation of the external chip enable signal /CE, the next read operation is performed.

Figure 11:
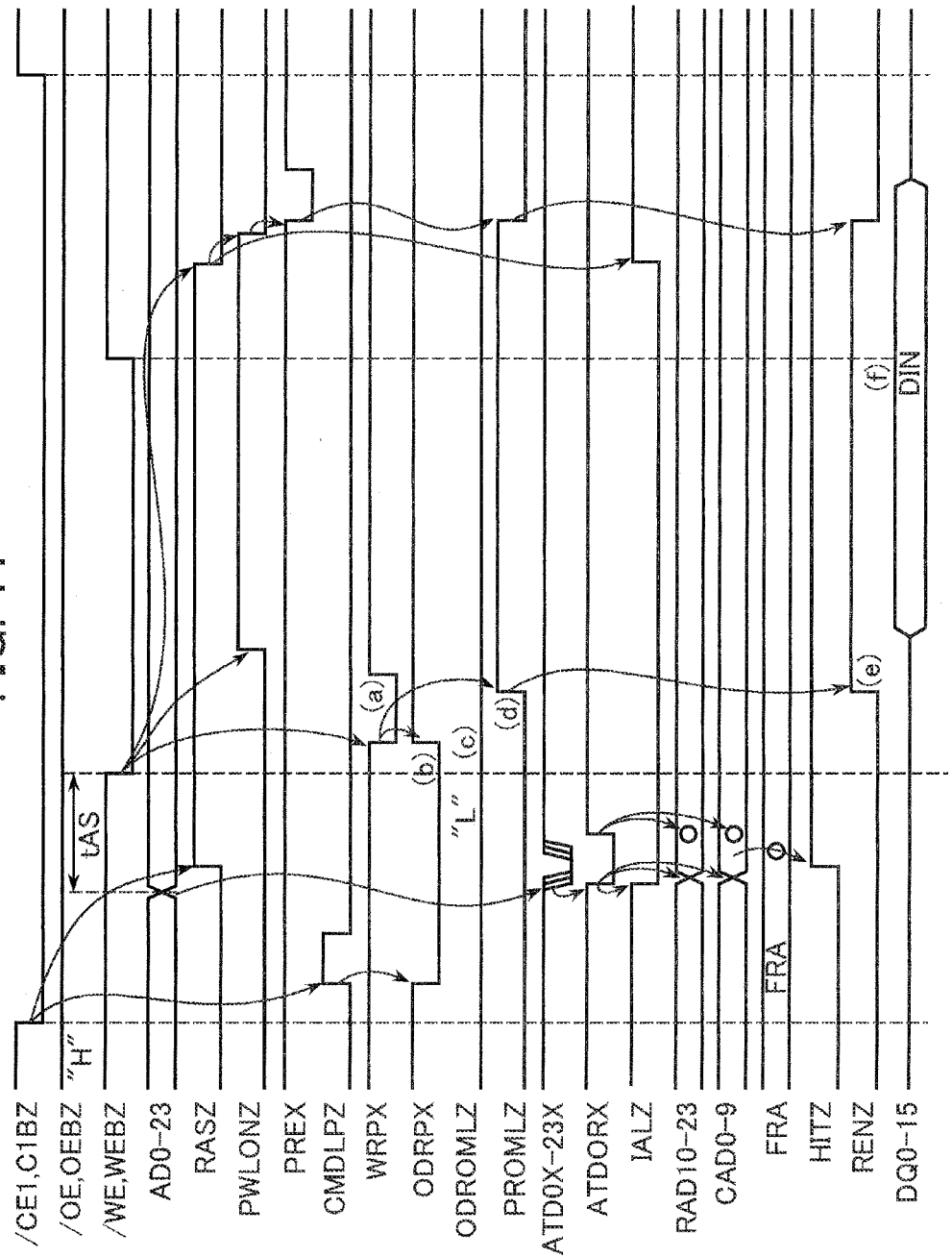
FIG. 11 shows a write operation according to the first embodiment.

FIG. 11 shows the write operation in the first embodiment. Descriptions of the operations that are the same as those in FIG. 10 will be reduced or omitted. The row address signal RAD among the address signals AD is the defective address stored in the program circuit 28 in FIG. 1. For the above reason, the redundancy word line RWL is selected instead of the real word line WL. The operation until the activation of the hit signal HITZ is the same as that in FIG. 10. The write operations in the following embodiments that will be disclosed below are the same as that in FIG. 11.

The command generation circuit 10 shown in FIG. 1 activates the write command signal WRPX in synchronization with the activation of the external write enable signal /WE (FIG. 11(a)). The command generation circuit 10 deactivates the output prohibition signal ODRPX in synchronization with the activation of the write command signal WRPX (FIG. 11(b)). The preceding judgment signal ODROMLZ is not activated in the write operation in response to the write command (FIG. 11(c)). For the above reason, the redundancy judgment signal generation circuit 18 in FIG. 1 activates the redundancy judgment signal PROMLZ after the predetermined period (DLY3) has elapsed from the activation of the write command signal WRPX (FIG. 11(d)). The redundancy judgment circuit 32 in FIG. 1 activates the redundancy enable signal RENZ in synchronization with the activation of the redundancy judgment signal PROMLZ (FIG. 11(e)). Thereafter the redundancy word line RWL is selected and the write operation is performed. For example, a write data signal DIN is supplied from an outside of the memory MEM in synchronization with a rising edge of the external write enable signal /WE (FIG. 11(f)). The operation after the deactivation of the basic timing signal RASZ is the same as that in FIG. 10.

The redundancy judgment is made based on the address signal AD latched in synchronization with transition of the address signal AD before the external output enable signal /OE is activated, whereby the redundancy enable signal RENZ (the result of the redundancy judgment) is promptly output. That is to say, the redundancy judgment after the activation of the external output enable signal /OE is not necessary. As a result, the access time tOE from the activation of the external output enable signal /OE until the output of a read data DQ is reduced. Consequently, the read data DQ is output early and a read cycle time that is a interval for supplying the read command is reduced.

Figure 12:
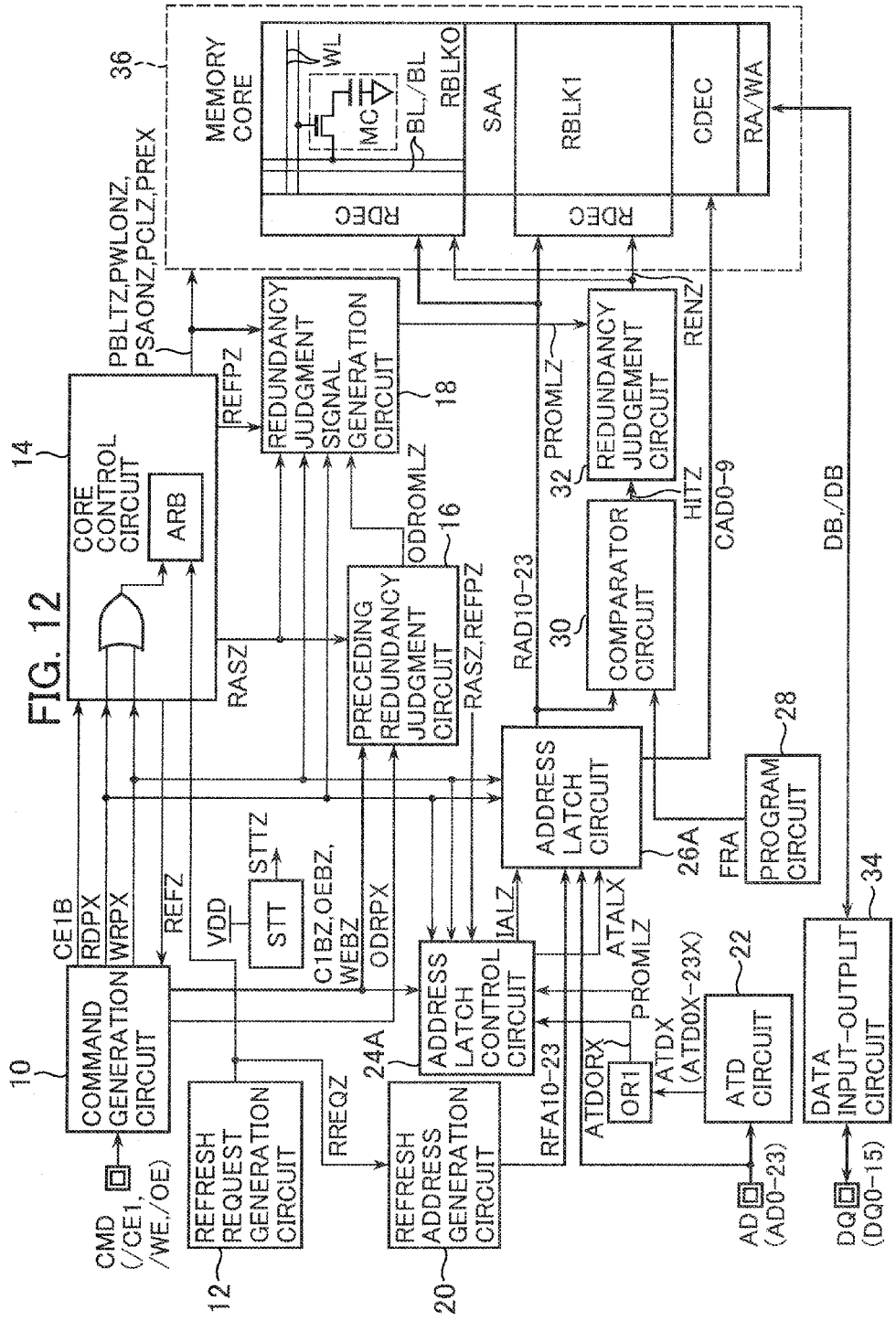
FIG. 12 shows a second embodiment.

FIG. 12 shows a second embodiment. The same reference symbols are given to the same elements as those shown in the first embodiment and their descriptions will be reduced or omitted. The second embodiment includes an address latch control circuit 24A and an address latch circuit 26A instead of the address latch control circuit 24 and the address latch circuit 26 in FIG. 1. Configurations other than the above are the same as those in FIGS. 1 to 5 and FIGS. 8 and 9. A semiconductor memory MEM is, for example, a Fast Cycle RAM (FCRAM) of pseudo SRAM type.

An OR circuit OR1 outputs an address transition detection signal ATDORX only to the address latch circuit 26A. An operation of the address latch control circuit 24A is the same as that of the address latch control circuit 24 in FIG. 1 except that the address latch control circuit 24A outputs an address latch signal ATALX in response to a redundancy judgment signal PROMLZ.

Figure 13:
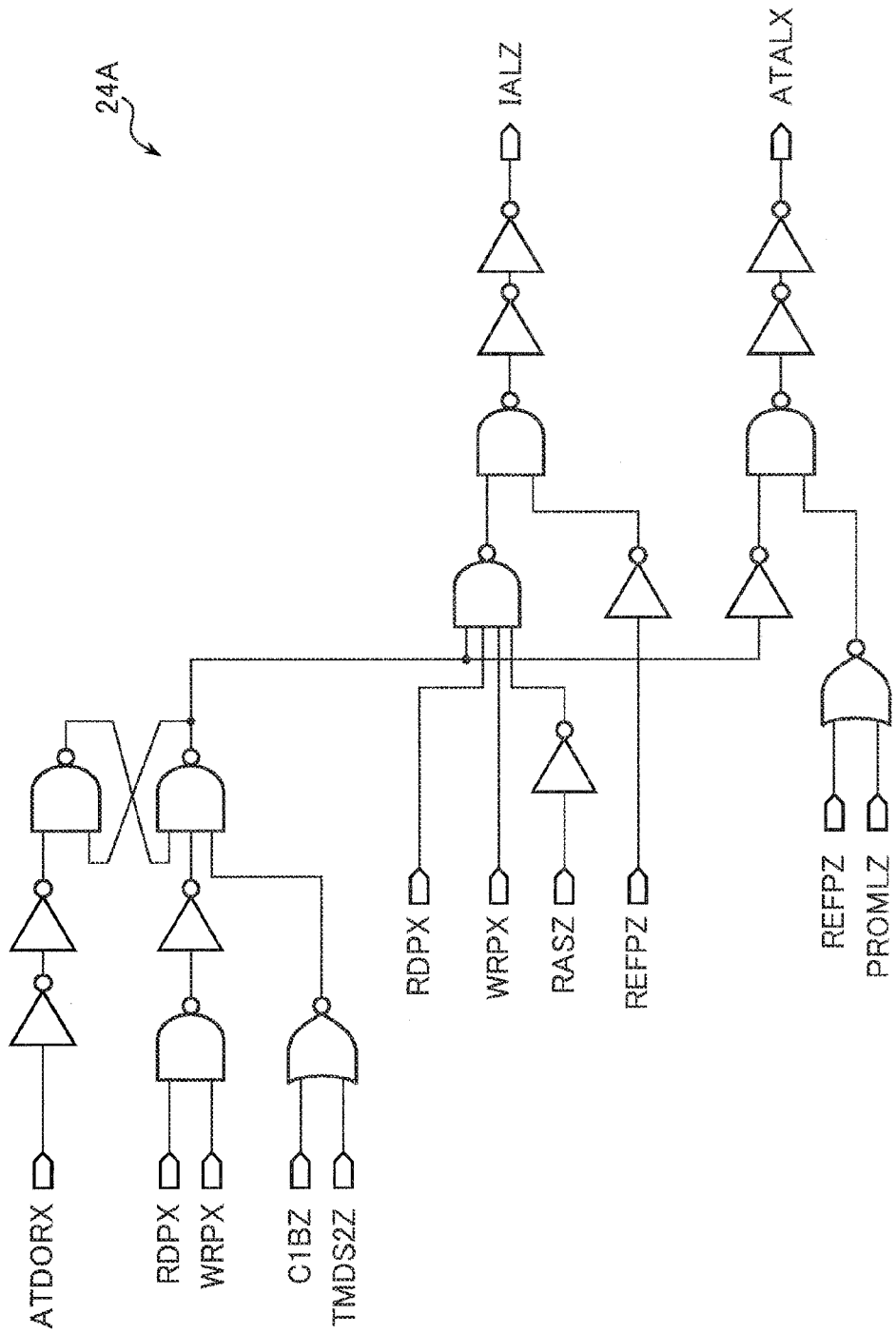
FIG. 13 shows an address latch control circuit according to the second embodiment.

FIG. 13 shows the address latch control circuit 24A in the second embodiment. Logic for generating the address latch signal ATALX is added to the address latch control circuit 24A. The address latch signal ATALX is activated in synchronization with activation of the address transition detection signal ATDORX and deactivated in synchronization with the activation of the redundancy judgment signal PROMLZ, a read command signal RDPX, or a write command signal WRPX. The activation of the address transition detection signal ATDORX is prohibited during activation of a refresh control signal REFPZ.

Figure 14:
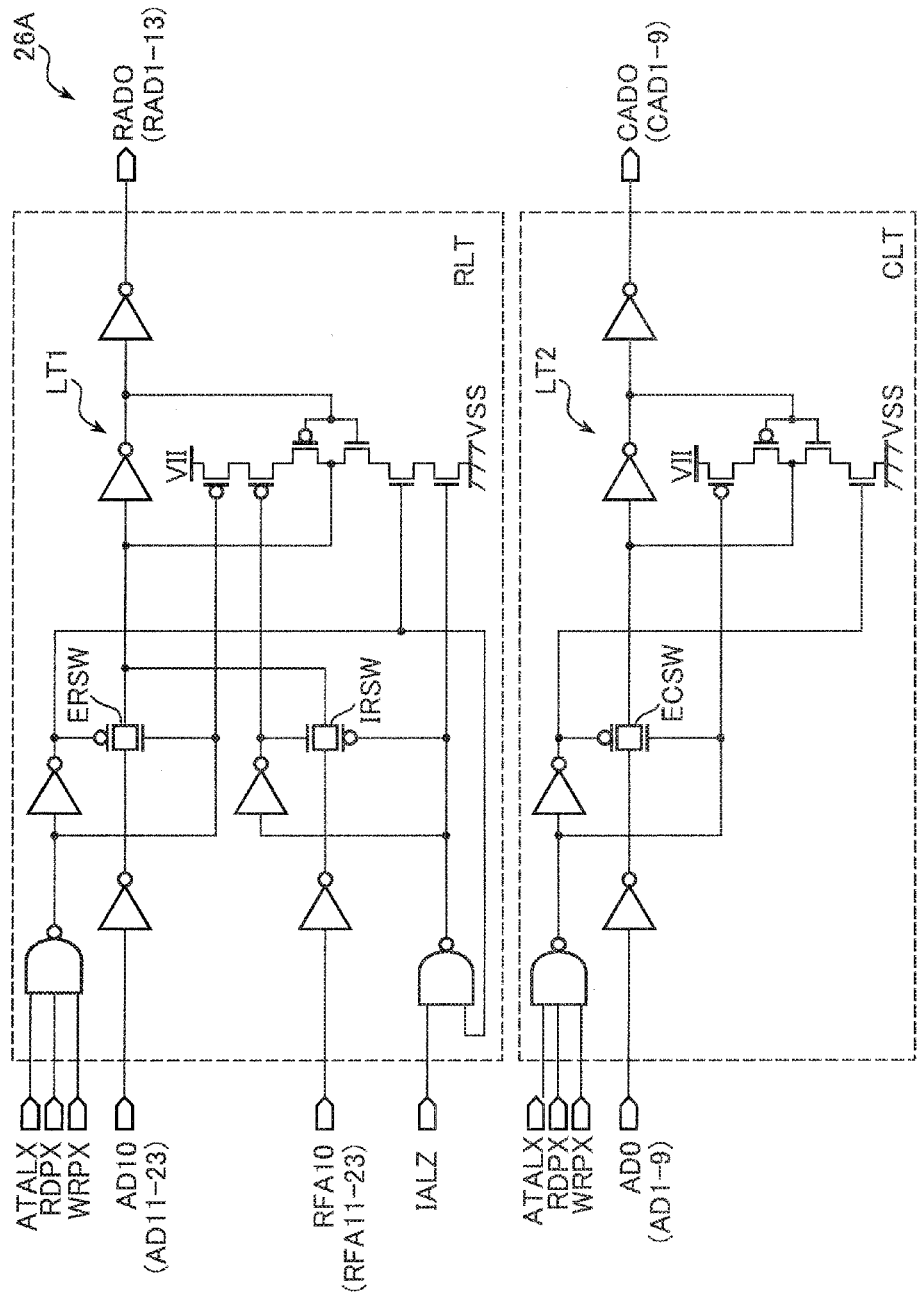
FIG. 14 shows an address latch circuit according to the second embodiment.

FIG. 14 shows the address latch circuit 26A in the second embodiment. An operation of the address latch circuit 26A is the same as that of the address latch circuit 26 (FIG. 7) except the address latch circuit 26A receives the address latch signal ATALX instead of the address transition detection signal ATDORX.

Figure 15:
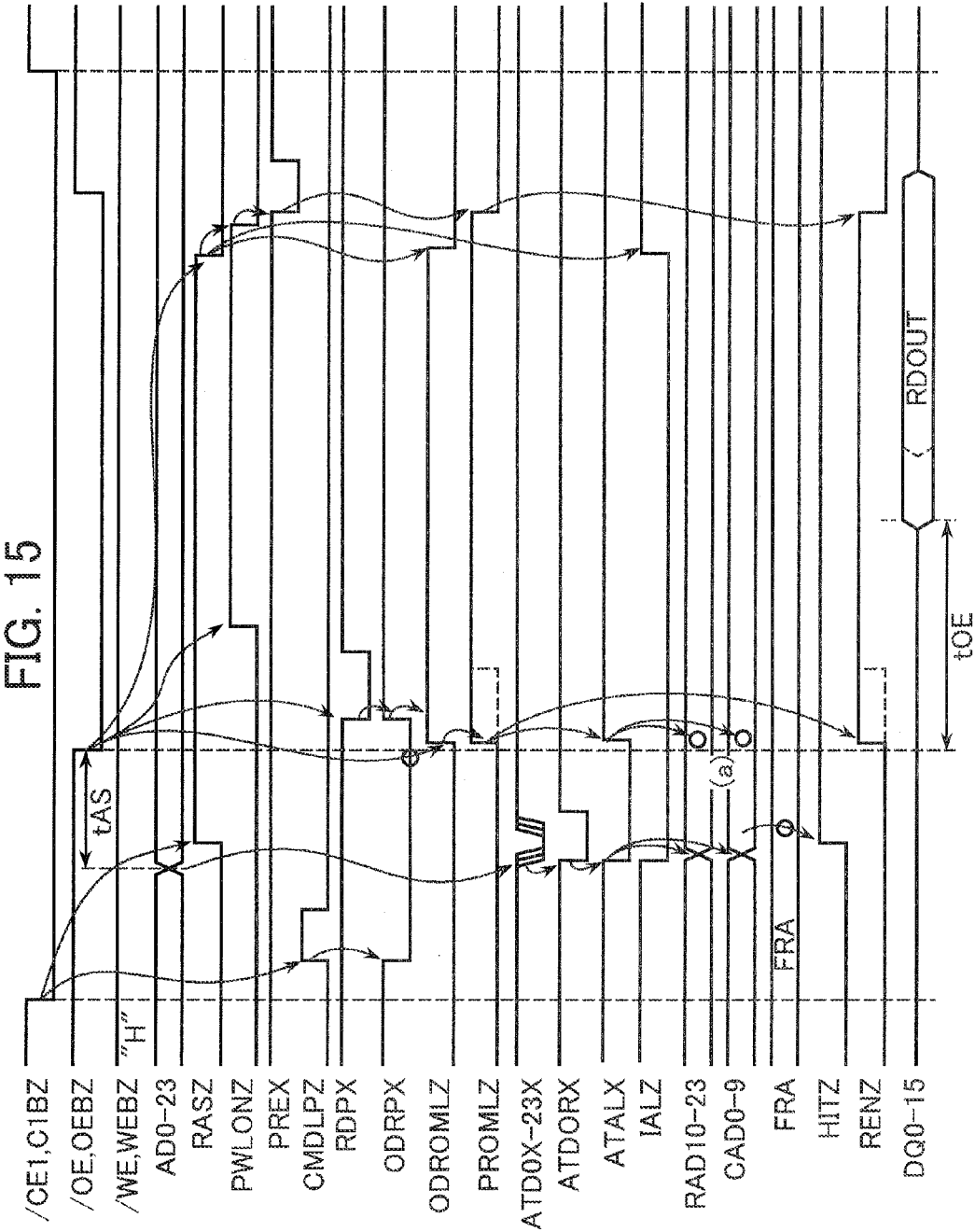
FIG. 15 shows a read operation according to the second embodiment.

FIG. 15 shows a read operation in the second embodiment. Descriptions of the operations that are the same as those in FIG. 10 will be reduced or omitted. A row address signal RAD in an address signals AD is a defective address stored in a program circuit 28. For the above reason, a redundancy word line RWL is selected instead of a real word line WL. The address latch circuit 26A latches the address signals AD (RAD10 to RAD23 and CAD0 to CAD9) (FIG. 15(a)) in synchronization with a rising edge of the address latch signal ATALX (FIG. 15(a)). Latch timing of the address signal AD is late in comparison with the first embodiment (FIG. 10). Operations in the second embodiment are the same as those in FIG. 10 except the latch timing of the address latch circuit 26A.

The address signals AD0 to AD23 are latched at the rising edge of the address latch signal ATALX, whereby a timing margin changes in the address signals AD0 to AD23 until the latch of the address signals AD0 to AD23 is larger. Since the address signals AD0 to AD23 are latched at the rising edge of the address transition detection signal ATDORX generated based upon the changes in the address signals AD0 to AD23 in the first embodiment (FIG. 10), the timing margin of the address latch circuit 26 is small.

The second embodiment has the same advantages as those of the first embodiment. In addition, the margin of the latch timing for the address latch circuit 26A in the second embodiment is large. Consequently, a circuit processing the address signals AD0 to AD23, such as an ATD circuit 22, an OR circuit OR1 or the like, is designed without regard to the above-described margin.

Figure 16:
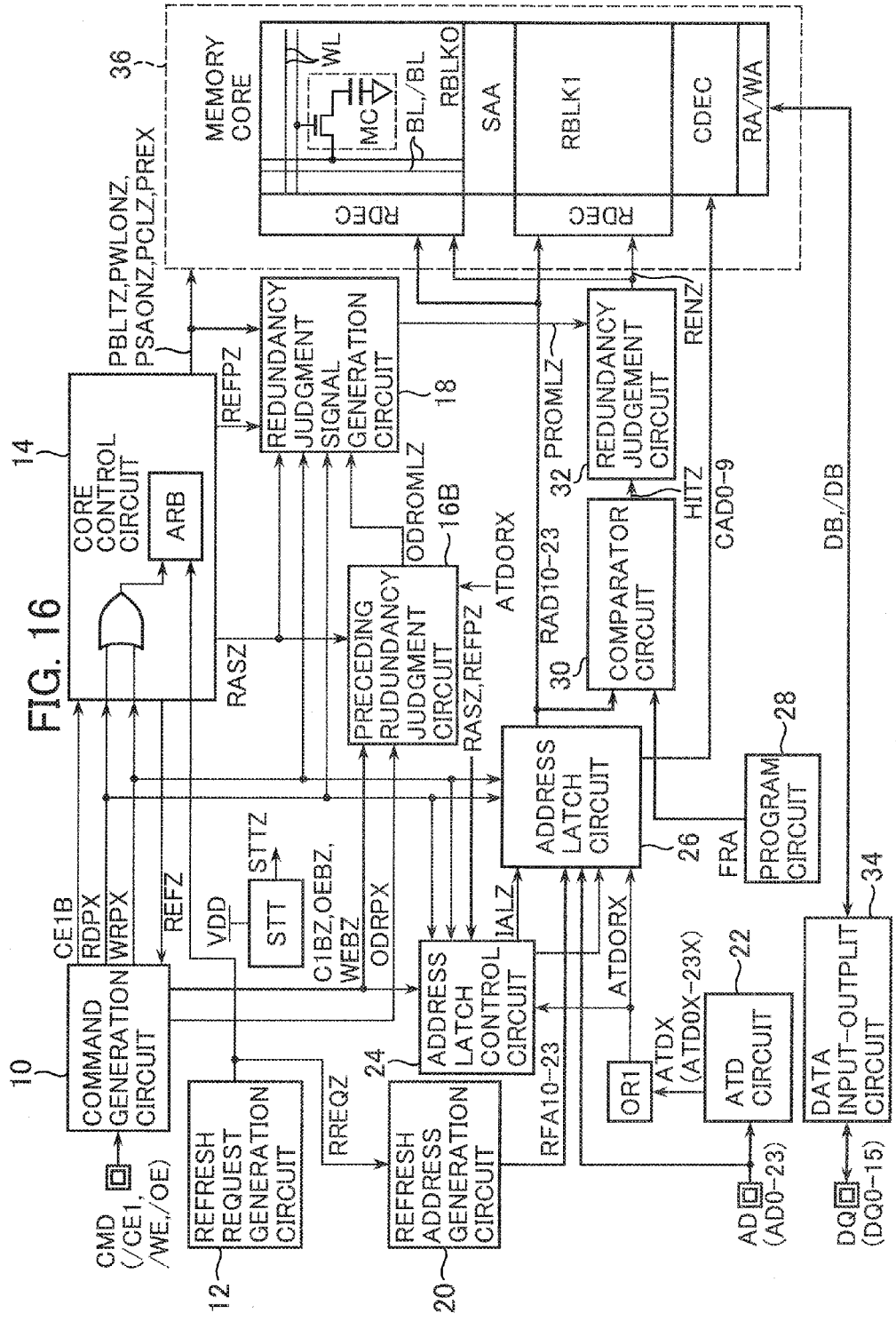
FIG. 16 shows a third embodiment.

FIG. 16 shows a third embodiment. The same reference symbols are given to the same elements as those shown in the first and the second embodiments and their descriptions will be reduced or omitted. The third embodiment includes a preceding redundancy judgment circuit 16B instead of the preceding redundancy judgment circuit 16 in the first embodiment (FIG. 1). Configurations other than the above are the same as those in FIGS. 1 and 2 and FIGS. 4 to 9. A semiconductor memory MEM is, for example, a Fast Cycle RAM (FCRAM) of pseudo SRAM type.

The preceding redundancy judgment circuit 16B prohibits activation of a preceding judgment signal ODROMLZ upon activation of an external output enable signal /OE during a change in an address signal AD. The preceding redundancy judgment circuit 16B recognizes a timing in a change of the address signal AD based on the address transition detection signal ATDORX. For example, when the external output enable signal /OE is activated immediately after the change in the address signal AD, it may occur that the redundancy judgment circuit 32 starts an operation thereof before a comparator circuit 30 outputs a hit signal HITZ (that is to say, before a determination of a redundancy judgment). A memory core 36 malfunctions in the above case. The third embodiment generates a redundancy judgment signal PROMLZ in response to a read command signal RDPX when activation timing of the external output enable signal /OE overlaps with the change in timing of the address signal AD, in order to prevent the malfunction.

Figure 17:
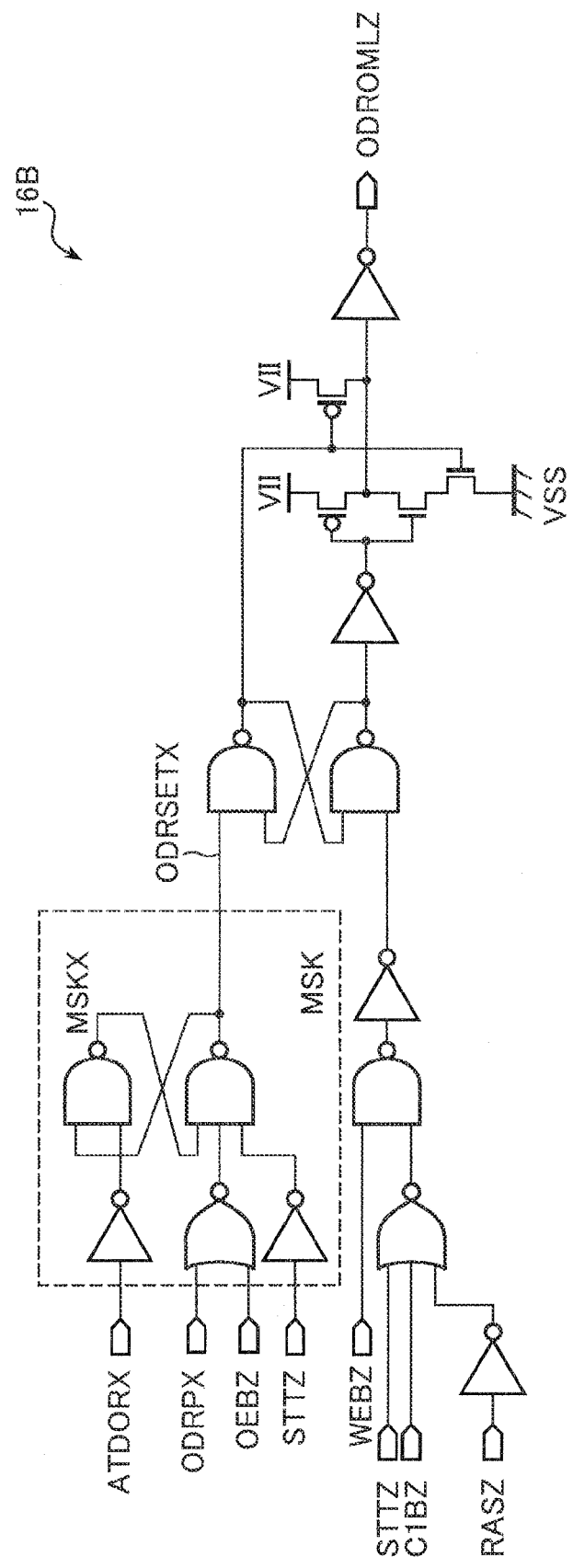
FIG. 17 shows a preceding redundancy judgment circuit according to the third embodiment.

FIG. 17 shows the preceding redundancy judgment circuit 16B in the third embodiment. The preceding redundancy judgment circuit 16B includes a mask circuit MSK. The mask circuit MSK prohibits activation of a set signal ODRSETX to generate the preceding judgment signal ODROMLZ while the address transition detection signal ATDORX is at an L level. The mask circuit MSK activates a mask signal MSKX to an L level during the period in which the address transition detection signal ATDORX is at the L level. Activation of the preceding judgment signal ODROMLZ in synchronization with a falling edge of the external output enable signal /OE is prohibited during the change in any of the address signals AD0 to AD23, in the third embodiment.

Figure 18:
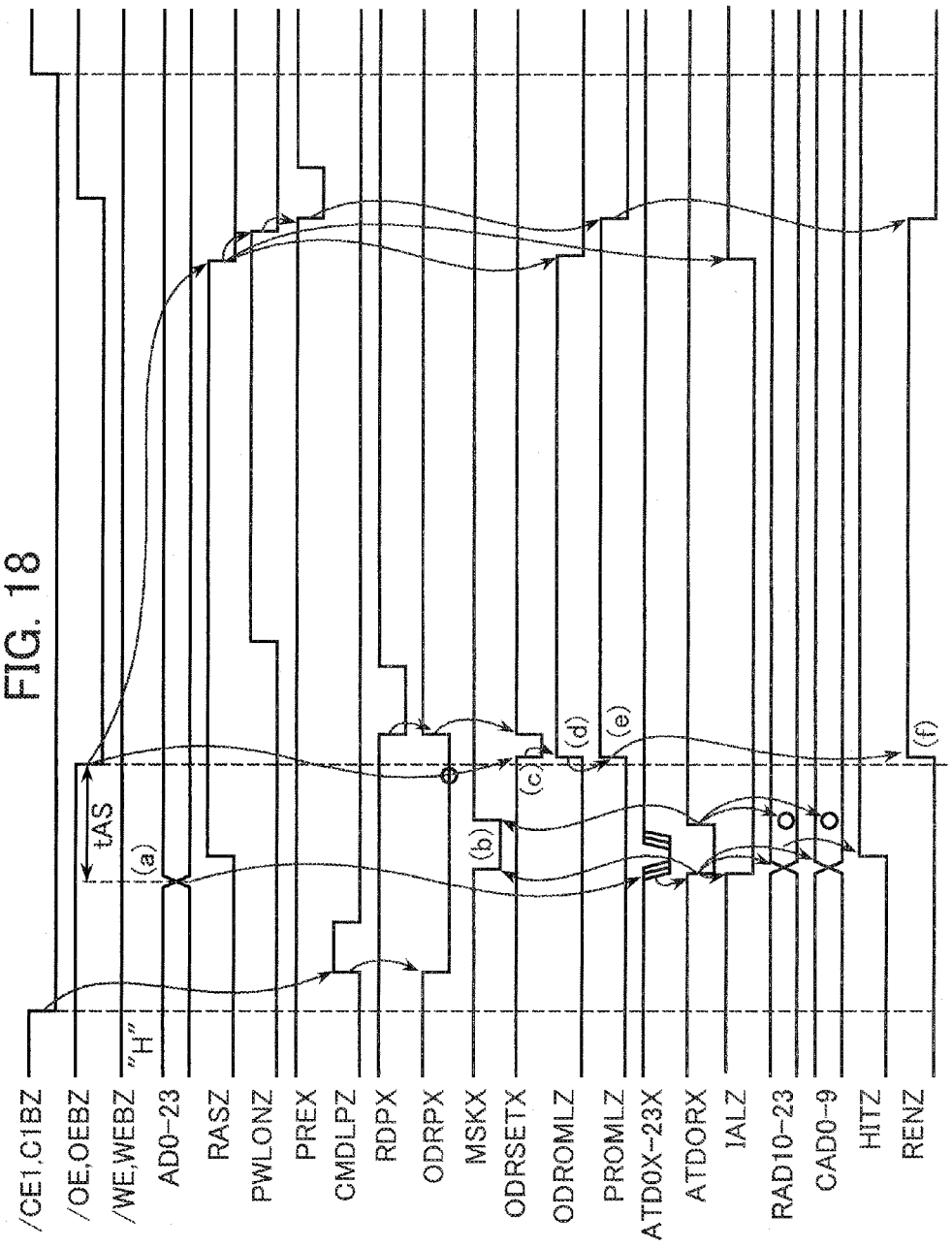
FIG. 18 shows a read operation according to the third embodiment.

FIG. 18 shows the read operation in the third embodiment. Descriptions of the operations that are the same as those in the second embodiment (FIG. 10) will be reduced or omitted. A row address signal RAD among the address signals AD is a defective address stored in the program circuit 28. A redundancy word line RWL is selected instead of a real word line WL.

A setup time tAS of the address signals AD0 to AD23 with respect to a falling edge of the external output enable signal /OE is large enough (for example, 5 ns (nanoseconds)). That is to say, the falling edge of the external output enable signal /OE appears after the address signals AD0 to AD23 has changed (FIG. 18(a)). The mask signal MASKX is activated during the period in which the address transition detection signal ATDORX is at the L level (FIG. 18(b)). When the external output enable signal /OE is activated, the mask signal MSKX is being deactivated. For the above reason, the set signal ODRSETX is activated in synchronization with the falling edge of the external output enable signal /OE (FIG. 18(c)). The preceding redundancy judgment circuit 16B in FIG. 16 activates the preceding judgment signal ODROMLZ in synchronization with the activation of the set signal ODRSETX (FIG. 18(d)). The redundancy judgment signal generation circuit 18 in FIG. 16 activates the redundancy judgment signal PROMLZ in synchronization with the activation of the preceding judgment signal ODROMLZ (FIG.

18(*e*)). A redundancy judgment circuit 32 in FIG. 16 activates a redundancy enable signal RENZ in synchronization with the activation of the external output enable signal /OE (FIG. 18(*f*)). The third embodiment performs the read operation at the same timing as that in FIG. 10.

Figure 19:
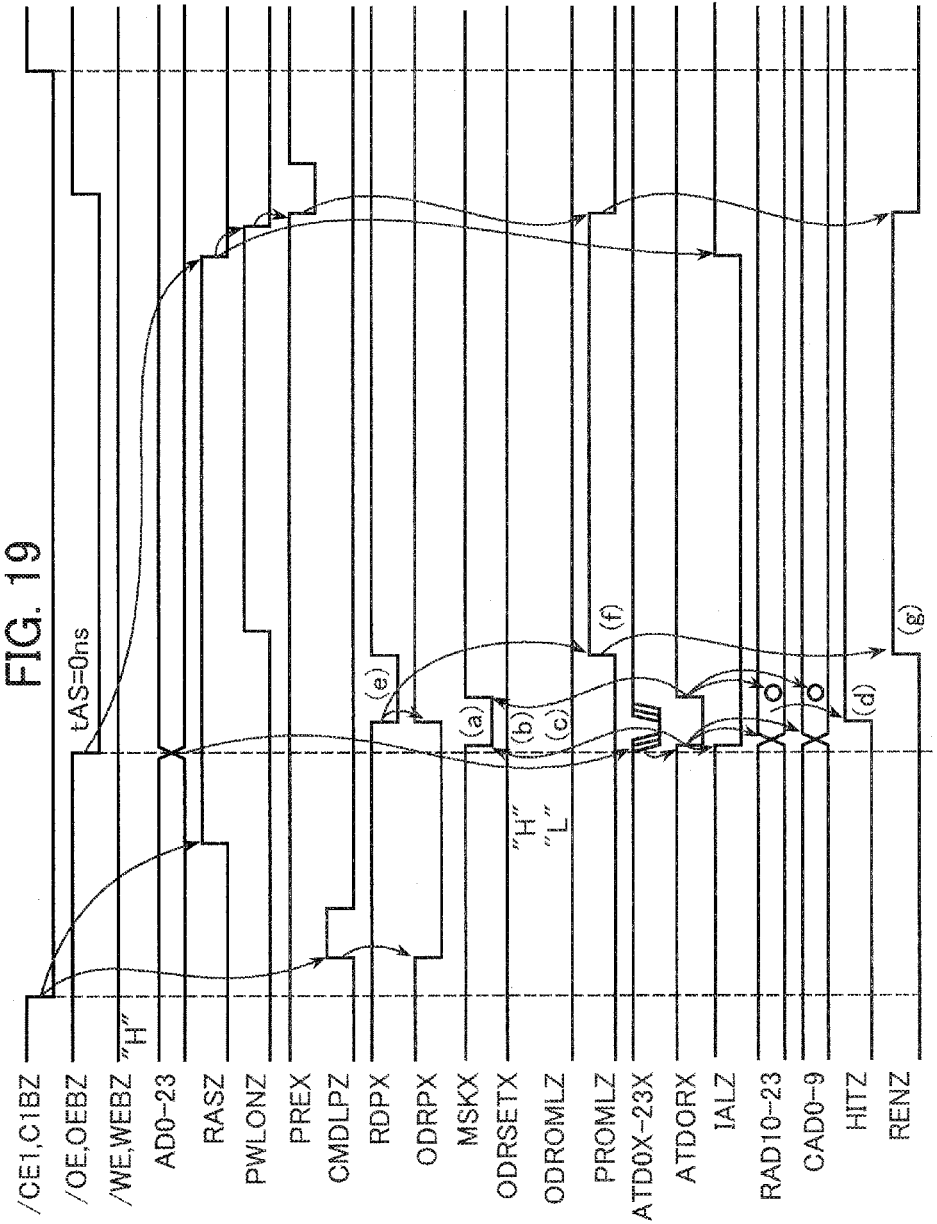
FIG. 19 shows another example of a read operation according to the third embodiment.

FIG. 19 shows another example of the read operation in the third embodiment. Row address signal RAD among the address signals AD is a defective address stored in the program circuit 28. The redundancy word line RWL is selected instead of the real word line WL. The external output enable signal /OE is activated substantially contemporaneously with the changes in the address signals AD0 to AD23 in the read operation shown in FIG. 19. The setup time tAS of the address signals AD0 to AD23 with respect to the falling edge of the external output enable signal /OE is, for example, 0 ns (nanoseconds).

The mask signal MSKX is being activated upon the activation of the external output enable signal /OE (FIG. 19(*a*)). For the above reason, the mask circuit MSK shown in FIG. 17 prohibits the activation of the set signal ODRSETX in response to the external output enable signal /OE. In other words, the set signal ODRSETX is held at a high level H. Consequently, the activation of the preceding judgment signal ODROMLZ is prohibited (FIG. 19(*b*)) and the activation of the redundancy judgment signal PROMLZ is prohibited (FIG. 19*c*)

An output of the preceding judgment signal ODROMLZ is cancelled when a command indicating that the external chip enable signal /CE1 and the external output enable signal /OE are both activated is detected during the period in which the address transition detection signal ATDORX is at the L level (between the start of the detection of transition of the address signal AD and the end of the detection of transition of the address) Since the address signal AD is latched based on the activation of the address transition detection signal ATDORX, a comparator circuit 30 in FIG. 16 activates the hit signal HITZ (FIG. 19(*d*)).

The read command signal RDPX is activated in synchronization with the activation of the external output enable signal /OE (FIG. 19(*e*)) The redundancy judgment signal generation circuit 18 in FIG. 16 activates the redundancy judgment signal PROMLZ after a predetermined period (DLY3) has elapsed from the activation of the read command signal RDPX (FIG. 19(*f*)). That is to say, when the preceding redundancy judgment circuit 16B in FIG. 16 detects the start of the address detection by the ATD circuit 22 and the activation of the output enable signal OEBZ, the redundancy judgment signal generation circuit 18 outputs the redundancy judgment signal PROMLZ after the predetermined period (DLY3) has elapsed from the input of the read command signal RDPX, without use of a path (a path including the ODROMLZ signal) from the preceding redundancy judgment circuit 16B. A comparison operation by the comparator circuit 30 is completed at this point of time. Thereafter the redundancy enable signal RENZ is activated (FIG. 19(*g*)), and then the read operation is performed.

The third embodiment has the same advantages as those of the first and the second embodiments. The third embodiment masks the activation of the preceding judgment signal ODROMLZ in response to the change in the address signal AD. Consequently, the third embodiment may reduce the setup time tAS of the address signal AD with respect to the falling edge of the external output enable signal /OE close to 0 ns (nanoseconds). Thus, in the third embodiment, the input timing of the address signal AD may be more freely set, so that usability of the memory MEM may be improved.

Figure 20:
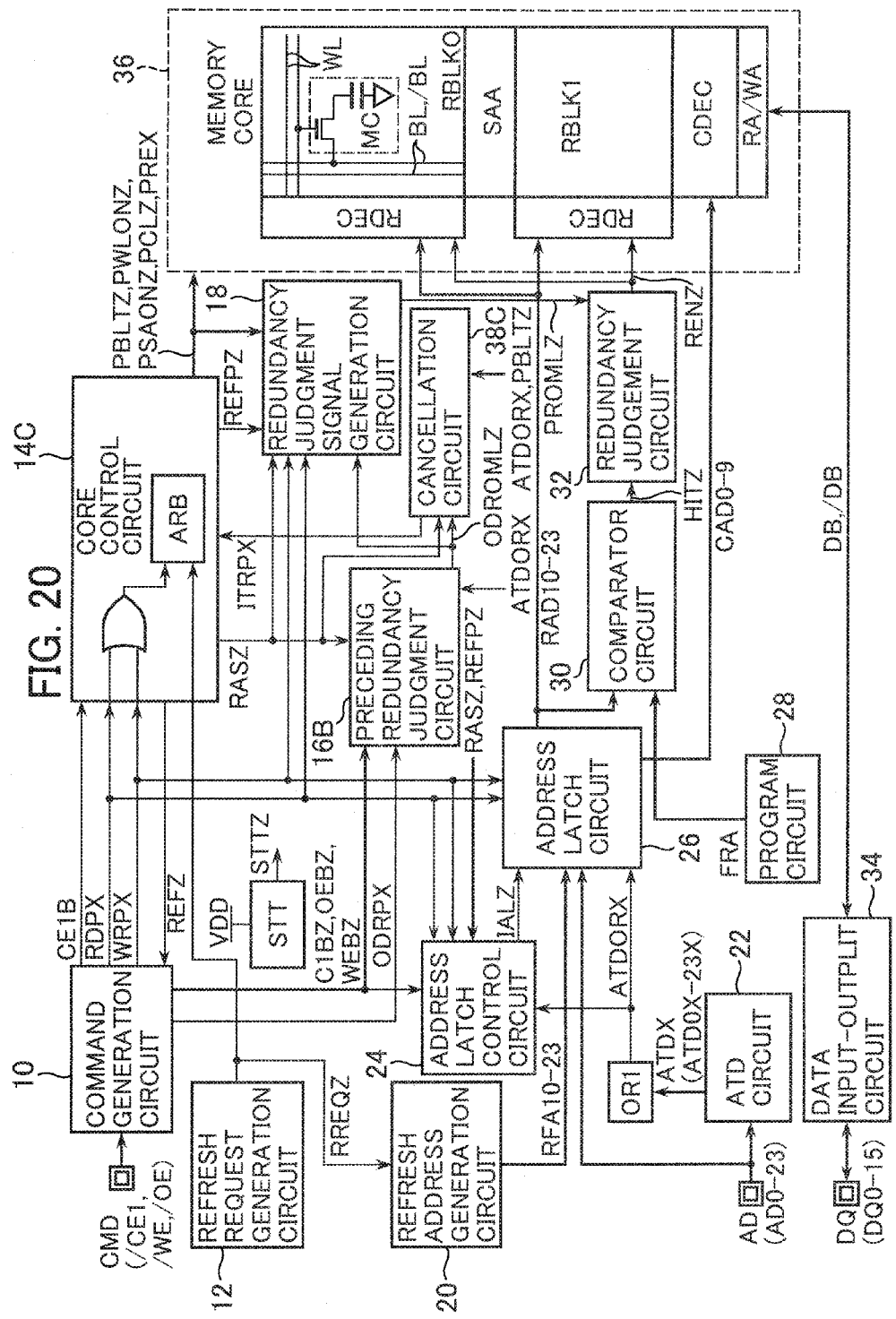
FIG. 20 shows a fourth embodiment.

FIG. 20 shows a fourth embodiment. The same reference symbols are given to the same elements as those shown in the first, the second, and the third embodiments and their descriptions will be reduced or omitted. The fourth embodiment includes a core control circuit 14C, instead of the core control circuit 14 in FIG. 16, and includes a cancellation circuit 38C. Configurations other than the above are the same as those in the third embodiment (FIG. 16). A semiconductor memory MEM is, for example, a Fast Cycle RAM (FCRAM) of pseudo SRAM type.

The cancellation circuit 38C outputs an interruption signal ITRPX and causes the core control circuit 14C to execute a cancellation operation when a mask circuit MSK in FIG. 17 cannot prohibit generation of a preceding judgment signal ODROMLZ. That is to say, when the preceding judgment signal ODROMLZ and a redundancy judgment signal PROMLZ are activated by mistake due to a change in an address signal AD in a period from activation of an external output enable signal /OE until activation of a bit control signal PBLTZ, a pre-charge control signal PREX is activated in order to cancel the redundancy judgment signal PROMLZ activated by mistake.

Figure 21:
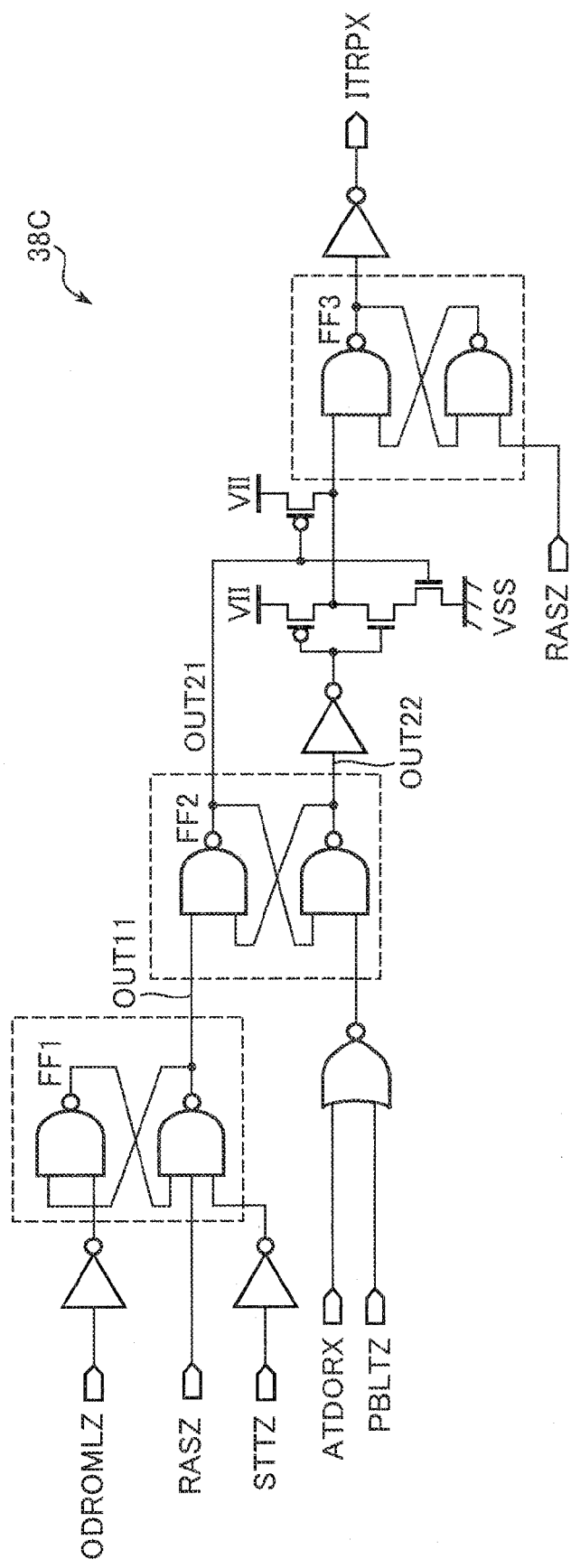
FIG. 21 shows a cancellation circuit according to the fourth embodiment.

FIG. 21 shows a cancellation circuit 38C in the fourth embodiment. The cancellation circuit 38C includes a flip-flop FF1 that detects the activation of the preceding judgment signal ODROMLZ, a flip-flop FF2 that activates the interruption signal ITRPX, and a flip-flop FF3 that deactivates the interruption signal ITRPX.

Figure 22:
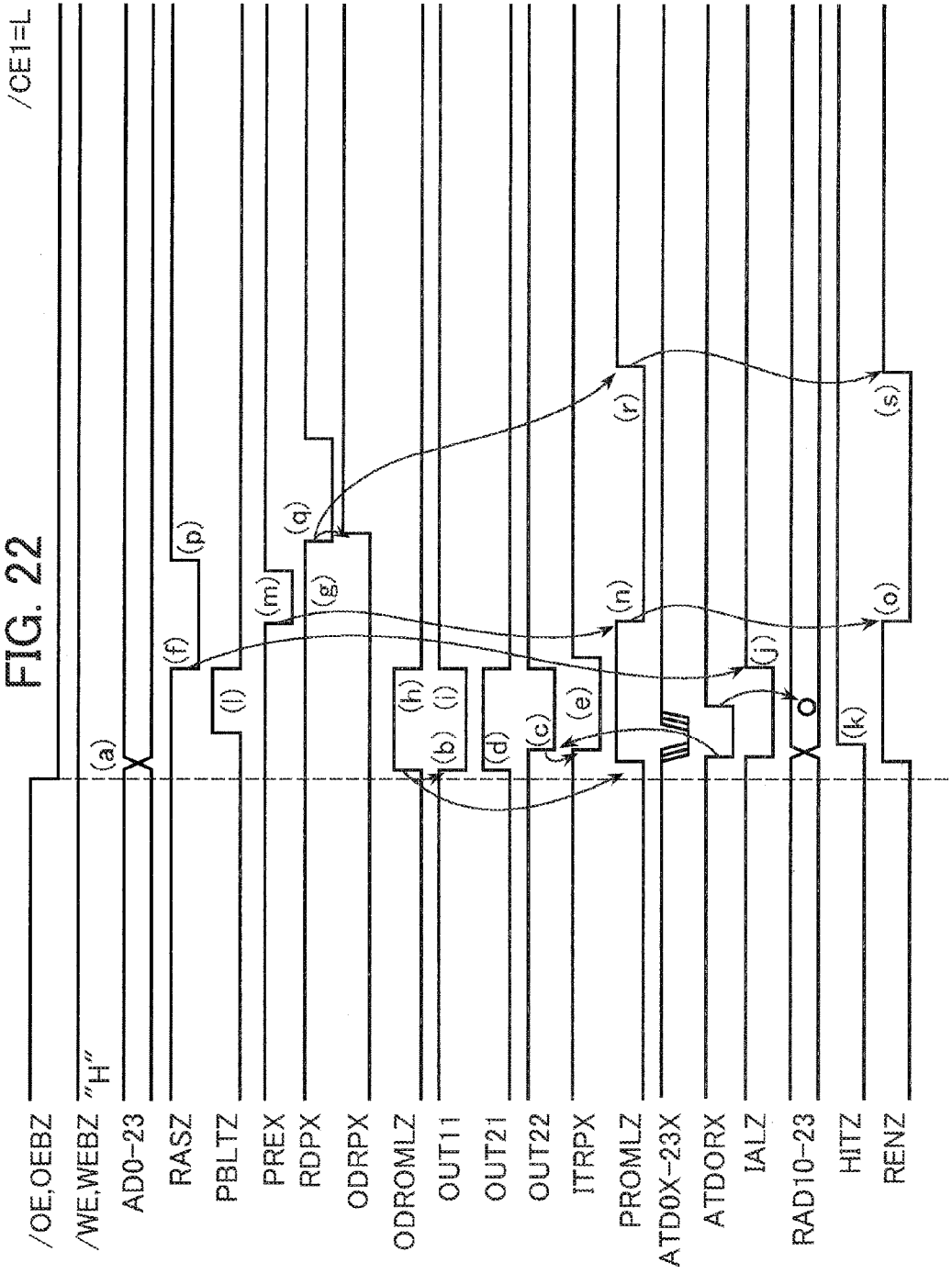
FIG. 22 shows a read operation according to the fourth embodiment.

FIG. 22 shows a read operation in the fourth embodiment. FIG. 22 shows an enlarged waveform before and after the activation of the external output enable signal /OE. Other waveforms are the same as those in the first embodiment (FIG. 10). A row address signal RAD among address signals AD is a defective address stored in a program circuit 28 in FIG. 20. For the above reason, a redundancy word line RWL is selected instead of a real word line WL. The address signal AD changes after the activation of the external output enable signal /OE, in the fourth embodiment (FIG. 22(*a*)).

The flip-flop FF1 in FIG. 21 sets an output node OUT11 to an L level in synchronization with the activation of the preceding judgment signal ODROMLZ (FIG. 22(*b*)). The flip-flop FF2 in FIG. 21 sets an output node OUT22 to an L level in response to activation of an address transition detection signal ATDORX before activation of a bit control signal PBLTZ (FIG. 22(*c*)). An output node OUT21 of the flip-flop FF2 is being set to an H level based on the activation of the preceding judgment signal ODROMLZ (FIG. 22(*d*)). In consequence, the interruption signal ITRPX is activated (FIG. 22(*e*)).

A core control circuit 14C in FIG. 20 deactivates a basic timing signal RASZ in response to activation of the interruption signal ITRPX (FIG. 22(*f*)). An access operation is cancelled by the interruption signal ITRPX from the cancellation circuit 38C. Thus access to the memory core 36 based on commands is prohibited upon detection of the commands indicating that an external chip enable signal /CE1 signal and the external output enable signal /OE signal are both activated before the activation of the address transition detection signal ATDORX (before a start of detection of transition of an address) by an ATD circuit 22.

At this point of time, a read command signal RDPX is not yet activated (FIG. 22(*g*)). The preceding judgment signal ODROMLZ is deactivated in synchronization with deactivation of the basic timing signal RASZ (FIG. 22(*h*)), the output node OUT11 is reset to an H level (FIG. 22(*i*)), and an internal address latch signal IALZ is activated (FIG. 22(*j*)). Since the address signal AD is latched based upon the activation of the address transition detection signal ATDORX, a comparator circuit 30 activates a hit signal HITZ (FIG. 22(k)).

The bit control signal PBLTZ is deactivated based upon the deactivation of the basic timing signal RASZ and the pre-charge control signal PREX is activated (FIGS. 22(l and m)) The redundancy judgment signal PROMLZ is deactivated based upon the activation of the pre-charge control signal PREX and a redundancy enable signal RENZ is deactivated (FIGS. 22(n and o)). That is to say, a redundancy judgment (a part of the read operation), which started based upon the preceding judgment signal ODROMLZ activated by mistake, is cancelled.

Since the external chip enable signal /CE1 is being activated at an L level, the core control circuit 14C in FIG. 20 again activates the basic timing signal RASZ (FIG. 22(p)). Thereafter the read command signal RDPX is activated (FIG. 22(q)). A redundancy judgment signal generation circuit 18 in FIG. 20 activates the redundancy judgment signal PROMLZ in synchronization with the read command signal RDPX (FIG. 22(r)).

The redundancy enable signal RENZ is again activated based upon the activated redundancy judgment signal PROMLZ (FIG. 22(s)) and the read operation is performed. That is to say, an access operation is started based upon the redundancy judgment signal PROMLZ activated after a predetermined period (DLY3) has elapsed from the read command signal RDPX, after cancellation of the access operation by the cancellation circuit 38C. When the cancellation circuit 38C detects the activation of the external output enable signal /OE (a predetermined command signal) before the ATD circuit 22 starts the address detection, the redundancy judgment signal generation circuit 18 outputs the redundancy judgment signal PROMLZ after the predetermined period (DLY3) has elapsed from an input of the read command signal RDPX, without use of a path (a path for the ODROMLZ signal) of the preceding redundancy judgment circuit 16. The cancellation circuit 38C detects the activation of the external output enable signal /OE based upon the activation of the preceding judgment signal ODROMLZ from the preceding redundancy judgment circuit 16B.

Figure 23:
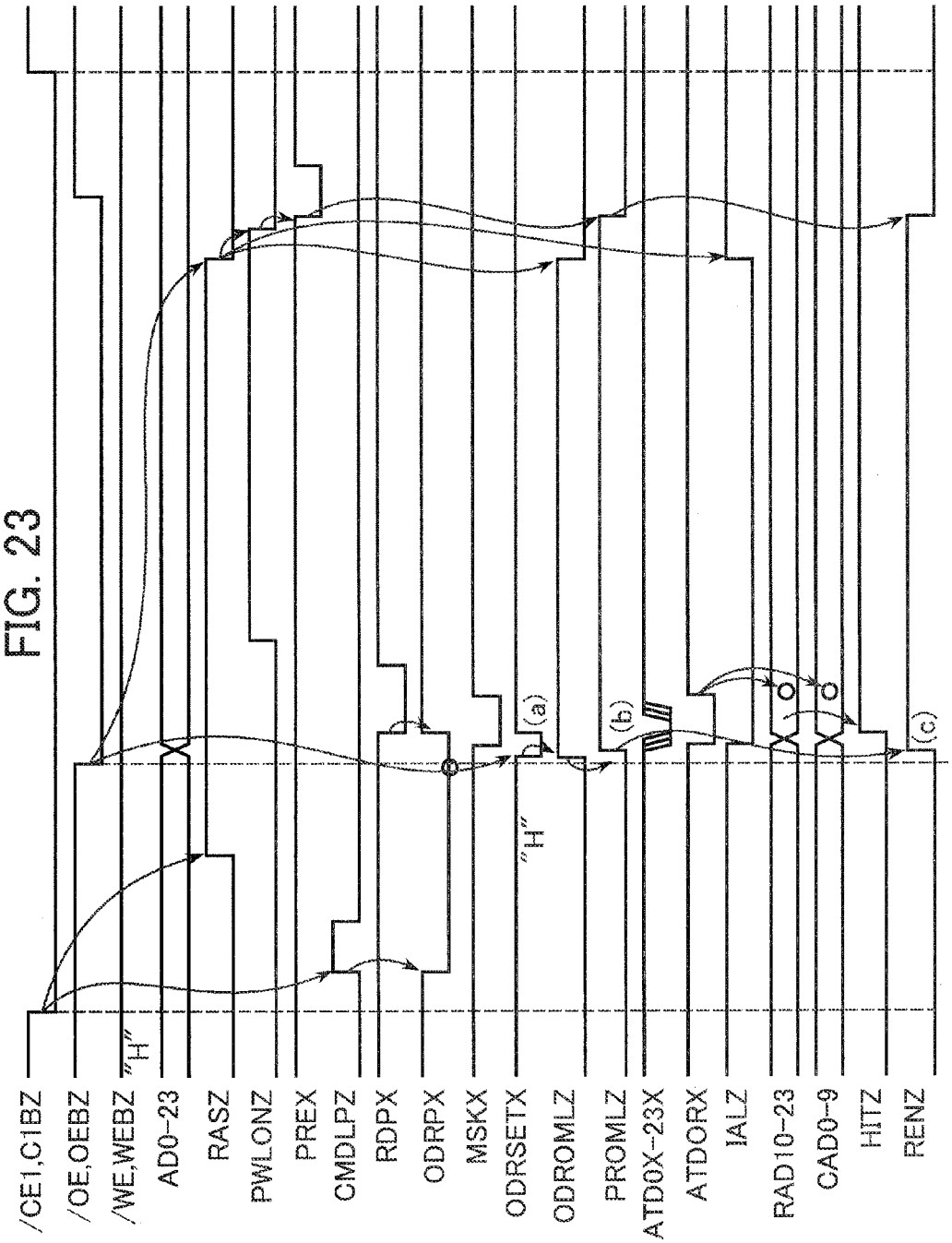
FIG. 23 shows the read operation by the memory.

FIG. 23 shows the read operation of the memory MEM. The memory MEM includes the preceding redundancy judgment circuit 16B shown in the third embodiment (FIG. 17). Activation timing of the external output enable signal /OE and timing of the change in the address signal AD are the same as the timing shown in FIG. 22. The row address signal RAD among the address signals AD is the defective address stored in the program circuit 28. The redundancy word line RWL is selected instead of the real word line WL.

If timing of a falling edge of the external output enable signal /OE is shifted from a low level period of a mask signal MSKX, a mask circuit MSK does not perform a mask operation. A set signal ODRSETX is activated as a result thereof (FIG. 23(a)) and the redundancy judgment signal PROMLZ is activated in synchronization with the activation of the external output enable signal /OE (FIG. 23(b)). In consequence, the redundancy judgment circuit 32 operates to output the redundancy enable signal RENZ before the comparator circuit 30 outputs the hit signal HITZ (before a determination of the redundancy judgment) (FIG. 23(c)). As a result, the memory MEM malfunctions. The fourth embodiment prevents the malfunction.

The fourth embodiment has the same advantages as those of the first, the second, and the third embodiments. In the fourth embodiment, even if a setup time tAS of the address signal AD with respect to the falling edge of the external output enable signal /OE is smaller than 0 ns (nanoseconds), a malfunction of the redundancy judgment circuit 32 is prevented, and a malfunction of the memory MEM is prevented. Thus, in the fourth embodiment, the timing of inputting the address signal AD may be more freely set, so that usability of the memory MEM may be improved.

The above-disclosed embodiments are applicable to the FCRAM of pseudo SRAM type. However, the above-disclosed embodiments may be applicable, for example, to a FCRAM of SDRAM type, a DRAM, an SRAM, or a ferro-electric memory.

The redundancy judgment signal PROMLZ is activated early at the time of the read operation and the access time tOE is reduced, in the above-disclosed embodiments. However, for example, the redundancy judgment signal PROMLZ is activated early at the time of the write operation, whereby the operation of the memory core 36 at the time of the write operation maybe started early. The write cycle time that is an interval for supplying the write command is reduced. Furthermore, the access cycle time that is the interval for supplying the read command or the write command is reduced.

Example embodiments of the present invention have now been described in accordance with the above advantages. It will be appreciated that these examples are merely illustrative of the invention. Many variations and modifications will be apparent to those skilled in the art.

The invention claimed is:

1. A semiconductor memory comprising:
   an address transition detection circuit that detects a transition of an address and outputting an address detection signal;
   an address input circuit that inputs an input address based upon the address detection signal;
   a command judgment circuit that decodes a command signal input and outputs a command judgment signal;
   a redundancy circuit that makes a redundancy judgment based on a redundancy judgment signal indicating a timing of a redundancy judgment; and
   a redundancy judgment speed-up circuit that controls an output of the redundancy judgment signal based on a predetermined command signal.

2. The semiconductor memory according to claim 1, wherein the predetermined command signal indicates that both a chip enable signal and an output enable signal are activated.

3. The semiconductor memory according to claim 1, wherein the redundancy circuit includes:
   a comparator circuit that compares the address and a redundancy address; and
   a redundancy judgment circuit that makes the redundancy judgment based on a result of the comparison and on the redundancy judgment signal.

4. The semiconductor memory according to claim 3, wherein the address is an external address.

5. The semiconductor memory according to claim 1, wherein the redundancy circuit includes a delay circuit that delays an output of the redundancy judgment signal based upon the command judgment signal.

6. The semiconductor memory according to claim 5, wherein when the command signal is not the predetermined command signal, the redundancy circuit makes the redundancy judgment based upon the redundancy judgment signal generated via the delay circuit.

7. The semiconductor memory according to claim 1, wherein when the predetermined command signal is detected before address detection or contemporaneously with a start of the address detection by the address transition detection circuit, the redundancy circuit does not output the redundancy judgment signal via the redundancy speed-up circuit.

8. The semiconductor memory according to claim 1, wherein the redundancy circuit includes a cancellation circuit that prohibits accessing a core circuit based upon the predetermined command signal when the predetermined command signal is detected between a start of address detection and an end of the address detection by the address transition detection circuit.

9. A semiconductor memory comprising:
   a latch circuit that latches an address based upon an address transition signal,
   wherein a first redundancy judgment signal for making a redundancy judgment at a first path based upon a first command signal is generated,
   wherein a second redundancy judgment signal is generated at a second path based upon a second command signal other than the first command signal, and,
   wherein a redundancy judgment is made based upon a result of comparing the address latched by the latch circuit with a redundancy address and on one of the first redundancy judgment signal and the second redundancy judgment signal.

10. The semiconductor memory according to claim 9, wherein the first command signal indicates that both a chip enable signal and an output enable signal are activated.

11. The semiconductor memory according to claim 9, wherein the first path includes a circuit that detects the first command signal and outputs a first pulse signal and, wherein the second path includes a circuit that outputs a second pulse signal by decoding and delaying the second command signal.

12. The semiconductor memory according to claim 11, wherein the first command signal is a read command signal and the second command signal is one of a write command signal and a refresh command signal.

13. A method of controlling a semiconductor memory comprising:
   latching an address based upon an address transition detection signal;
   receiving a first command signal and generating a first redundancy judgment signal based upon the first command signal;
   receiving a second command signal that is different from the first command signal and decoding the second command signal; and
   generating a second redundancy judgment signal by delaying a result of decoding.

14. The method of controlling the semiconductor memory according to claim 13, wherein the first command signal indicates that both a chip enable signal and an output enable signal are activated.

15. The method of controlling the semiconductor memory according to claim 13, wherein an output timing of the first redundancy judgment signal is earlier than an output timing of the second redundancy judgment signal.

16. The method of controlling the semiconductor memory according to claim 13, further comprising:
   comparing the address with a redundancy address; and
   judging whether or not to perform a redundancy judgment based upon a result of the comparison and on one of the first redundancy judgment signal and the second redundancy judgment signal.

17. The method of controlling the semiconductor memory according to claim 13, further comprising:
   canceling an output of the first redundancy judgment signal when the first command signal is detected before a start of the address detection or contemporaneously with the start of the address detection; and
   prohibiting accessing a core circuit based upon the first command signal when the first command signal is detected between a start of address detection and an end of the address detection.

18. A memory system comprising:
   a CUP; and
   a semiconductor memory that performs one of a read operation and a write operation based upon an address signal from the CPU, wherein the semiconductor memory includes:
   an address transition detection circuit that detects transition of the address signal and outputs an address detection signal;
   an address input circuit that outputs an input address based upon the address detection signal;
   a command judgment circuit that decodes a command signal input and outputs a command judgment signal; and
   a redundancy circuit that makes a redundancy judgment based upon a redundancy judgment signal indicating a timing of the redundancy judgment; and
   a redundancy judgment speed-up circuit that controls an output of the redundancy judgment signal based upon a predetermined command signal.

19. The memory system according to claim 18, wherein the predetermined command signal indicates that both a chip enable signal and an output enable signal are activated.

20. The memory system according to claim 18, wherein the redundancy circuit includes:
   a comparator circuit that compares the address signal and a redundancy address signal; and
   a redundancy judgment circuit that makes the redundancy judgment based upon a result of the comparison and on the redundancy judgment signal.

* * * * *